(12) United States Patent
Nakanishi et al.

(10) Patent No.: US 9,941,270 B2
(45) Date of Patent: Apr. 10, 2018

(54) SEMICONDUCTOR DEVICE AND DESIGN METHOD OF SAME

(71) Applicant: Panasonic Intellectual Property Management Co., Ltd., Osaka (JP)

(72) Inventors: Kazuyuki Nakanishi, Osaka (JP); Daisuke Matsuoka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/640,814

(22) Filed: Jul. 3, 2017

(65) Prior Publication Data

US 2017/0301665 A1    Oct. 19, 2017

Related U.S. Application Data

(63) Continuation of application No. PCT/JP2015/006309, filed on Dec. 18, 2015.

(30) Foreign Application Priority Data

Jan. 8, 2015 (JP) .................................. 2015-002650

(51) Int. Cl.
*H01L 23/60* (2006.01)
*H01L 27/02* (2006.01)
(Continued)

(52) U.S. Cl.
CPC ...... *H01L 27/0296* (2013.01); *G06F 17/5072* (2013.01); *H01L 21/823475* (2013.01);
(Continued)

(58) Field of Classification Search
CPC .......................... H01L 27/0274; H01L 27/0288
(Continued)

(56) References Cited

U.S. PATENT DOCUMENTS

| 5,886,558 A | 3/1999 | Iijima et al. |
| 6,031,257 A | 2/2000 | Noto et al. |

(Continued)

FOREIGN PATENT DOCUMENTS

| JP | 6-334045 | 12/1994 |
| JP | 9-172146 | 6/1997 |

(Continued)

OTHER PUBLICATIONS

International Search Report dated Feb. 9, 2016 in International Application No. PCT/JP2015/006309.

*Primary Examiner* — George Fourson, III
(74) *Attorney, Agent, or Firm* — Wenderoth, Lind & Ponack, L.L.P.

(57) ABSTRACT

A semiconductor device includes a semiconductor substrate having a predetermined region in which a standard cell is disposed, and also includes: a first circuit connected to a first ground power line; a second circuit that is connected to a second ground power line and formed from the standard cells; and a protection circuit interposed and connected between the first circuit and the second circuit. The protection circuit includes: a resistor connected in series between the first circuit and the second circuit; and a protector that is interposed and connected between a node of the resistor on the second circuit side and the second ground power line and clamps a potential difference between the node and the second ground power line to a predetermined voltage or lower. The protection circuit is formed in a protection cell disposed in the predetermined region.

21 Claims, 25 Drawing Sheets

(51) Int. Cl.
  *G06F 17/50* (2006.01)
  *H01L 23/528* (2006.01)
  *H02H 9/04* (2006.01)
  *H01L 49/02* (2006.01)
  *H01L 29/10* (2006.01)
  *H01L 29/06* (2006.01)
  *H01L 23/522* (2006.01)
  *H01L 21/8234* (2006.01)

(52) U.S. Cl.
  CPC ...... *H01L 23/5226* (2013.01); *H01L 23/5286* (2013.01); *H01L 27/0207* (2013.01); *H01L 27/0255* (2013.01); *H01L 27/0266* (2013.01); *H01L 27/0288* (2013.01); *H01L 28/20* (2013.01); *H01L 29/0684* (2013.01); *H01L 29/1095* (2013.01); *H02H 9/046* (2013.01); *H01L 27/0274* (2013.01)

(58) Field of Classification Search
  USPC .......................................... 257/361; 438/238
  See application file for complete search history.

(56) References Cited

U.S. PATENT DOCUMENTS

| | | | | |
|---|---|---|---|---|
| 6,608,744 | B1* | 8/2003 | Kato | H01L 27/0266 361/111 |
| 2004/0084730 | A1* | 5/2004 | Morishita | H01L 27/0262 257/360 |
| 2004/0135206 | A1* | 7/2004 | Kato | H01L 27/0266 257/355 |
| 2004/0225985 | A1 | 11/2004 | Kashiwagi et al. | |
| 2009/0135534 | A1* | 5/2009 | Ishii | H01L 27/0251 361/56 |
| 2011/0133253 | A1 | 6/2011 | Nakanishi et al. | |
| 2013/0234211 | A1 | 9/2013 | Nakanishi et al. | |

FOREIGN PATENT DOCUMENTS

| | | |
|---|---|---|
| JP | 11-3984 | 1/1999 |
| JP | 2000-332206 | 11/2000 |
| JP | 2004-335843 | 11/2004 |
| JP | 2005-57138 | 3/2005 |
| JP | 2006-245596 | 9/2006 |
| JP | 5331195 | 10/2013 |
| WO | 2011/048737 | 4/2011 |

* cited by examiner

SEMICONDUCTOR DEVICE AND DESIGN METHOD OF SAME

CROSS REFERENCE TO RELATED APPLICATIONS

This application is a U.S. continuation application of PCT International Patent Application Number PCT/JP2015/006309 filed on Dec. 18, 2015, claiming the benefit of priority of Japanese Patent Application Number 2015-002650 filed on Jan. 8, 2015, the entire contents of which are hereby incorporated by reference.

BACKGROUND

1. Technical Field

The present disclosure relates to a semiconductor device which includes a semiconductor substrate having a predetermined region in which a standard cell that is a circuit block defined in size in a predetermined direction is disposed, and to a design method of the semiconductor device.

2. Description of the Related Art

With a higher degree of integration achieved by technological development of micromachining and high-density packaging in processing fields in recent years, semiconductor integrated circuit devices (hereinafter, referred to as semiconductor devices) have become more vulnerable to damage resulting from electrostatic discharge (hereinafter, referred to as surge). For example, there is a strong possibility that an entry of surge from an external connection pad damages elements, such as an input circuit, an output circuit, an input-output circuit, and an internal circuit, and thereby degrades the elements in performance. For this reason, such an external connection pad is often provided with a protection circuit that protects the input circuit, the output circuit, the input-output circuit, and the internal circuit from the surge. It is common that such an electrostatic-discharge protection circuit that protects against the surge from the external connection pad is formed from a polysilicon resistor and a high-voltage MOS transistor having a thick gate oxide film (see Japanese Unexamined Patent Application Publication No. 2005-57138).

SUMMARY

Here, a semiconductor device may include a plurality of power supply systems to meet a demand for lower power consumption. In this case, a surge is likely to occur between signals of different power supply domains in the semiconductor device. When such a surge occurs, an element of a power supply domain where the surge enters may be destroyed. However, it is difficult for a conventional configuration to protect an internal circuit from the surge occurring between the different power supply domains. Note that a power supply domain may be simply referred to as a domain hereinafter.

In addition, further miniaturization of semiconductor devices is demanded.

In view of the aforementioned problem, the present disclosure provides a semiconductor device which can be miniaturized while an internal circuit is protected from a surge occurring between different power supply domains and also provides a design method of the semiconductor device.

To solve the aforementioned problem, a semiconductor device according to an aspect of the present disclosure is a semiconductor device which includes a semiconductor substrate having a predetermined region in which a standard cell that is a circuit block defined in size in a predetermined direction is disposed. The semiconductor device includes: a first circuit that is connected to a first ground power line; a second circuit that is connected to a second ground power line independent of the first ground power line and is formed from the standard cell comprising a plurality of standard cells; and a protection circuit that is interposed and connected between the first circuit and the second circuit, wherein the protection circuit includes: a resistor that is connected in series between the first circuit and the second circuit; and a protector that is interposed and connected between a node of the resistor on a second circuit side and the second ground power line and clamps a potential difference between the node and the second ground power line to a predetermined voltage or lower, and the protection circuit is formed in a protection cell disposed in the predetermined region and having a size, in the predetermined direction, that is an integer multiple of a size of the standard cell in the predetermined direction.

Moreover, a design method of a semiconductor device according to an aspect of the present disclosure is a design method of a semiconductor device which includes a semiconductor substrate having a predetermined region in which a standard cell that is a circuit block defined in size in a predetermined direction is disposed. The semiconductor device includes: a first circuit that is connected to a first ground power line; a second circuit that is connected to a second ground power line independent of the first ground power line and is formed from the standard cell comprising a plurality of standard cells; and a protection circuit that is interposed and connected between the first circuit and the second circuit. The protection circuit includes: a resistor that is connected in series between the first circuit and the second circuit; and a protector that is interposed and connected between a node of the resistor on a second circuit side and the second ground power line and clamps a potential difference between the node and the second ground power line to a predetermined voltage or lower. The design method includes: determining, in the predetermined region, arrangement positions of the plurality of standard cells forming the second circuit; and determining, in the predetermined region, an arrangement position of a protection cell in which the protection circuit is formed and which has a size, in the predetermined direction, that is an integer multiple of a size of the standard cell in the predetermined direction.

According to the present disclosure, while the internal circuit can be protected from the surge occurring between the different power supply domains, miniaturization can also be achieved.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, a semiconductor device and a design method of the semiconductor device according to embodiments of the present disclosure are described, with reference to the drawings. It should be noted that each of the embodiments described below shows a general or specific example. The numerical values, shapes, materials, structural elements, the arrangement and connection of the structural elements, steps, the processing order of the steps, and so forth described in the embodiments below are mere examples, and are not intended to limit the present disclosure. Thus, among the structural elements in the embodiments below, structural elements not recited in any one of the independent claims indicating top concepts according to the present disclosure are described as arbitrary structural elements. Moreover, note also that each of the drawings is only a schematic diagram and is not necessarily a precise representation of, for example, the sizes of the structural elements.

EMBODIMENT 1

Figure 1:
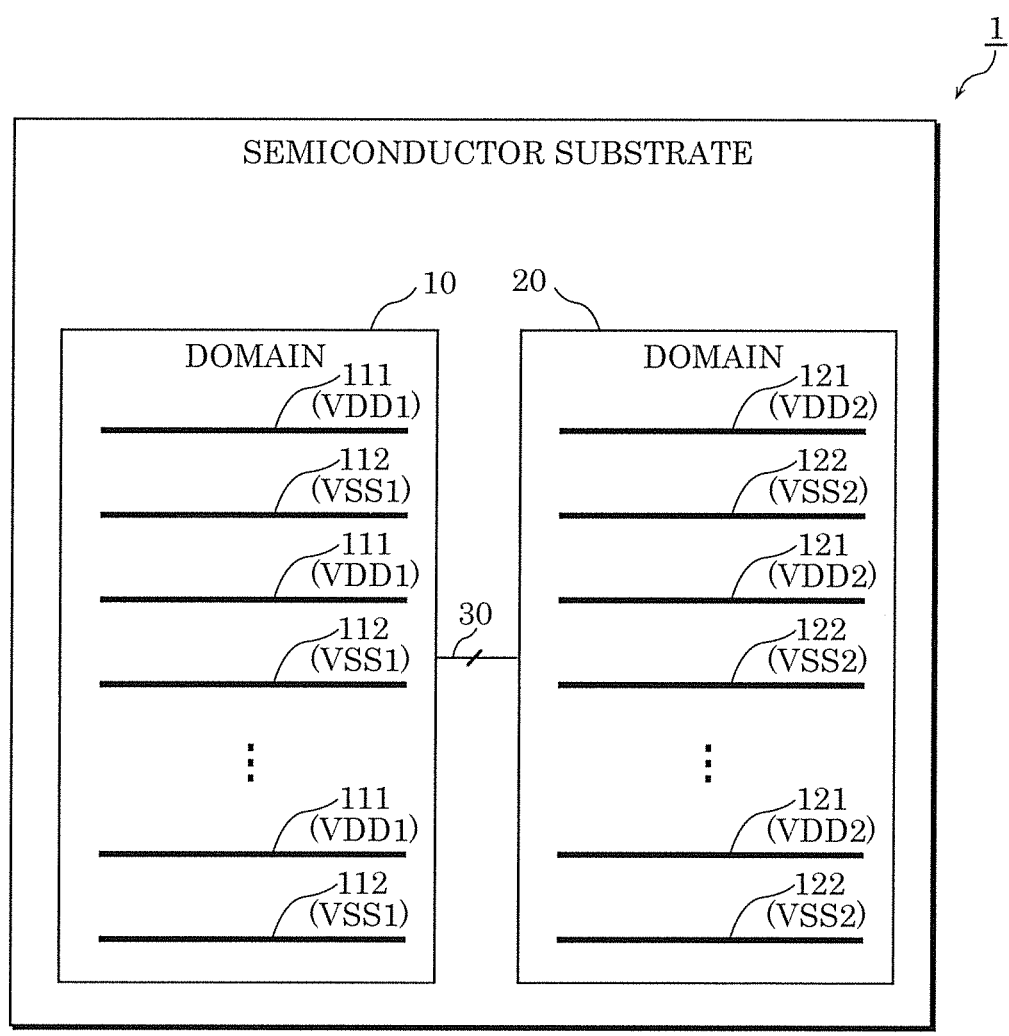
FIG. 1 is a schematic layout diagram showing an entire configuration of a semiconductor device, according to Embodiment 1.

Firstly, a configuration of semiconductor device 1 according to Embodiment 1 is described in detail. FIG. 1 is a schematic layout diagram showing an entire configuration of semiconductor device 1, according to Embodiment 1.

As shown in FIG. 1, semiconductor device 1 includes domain 10 and domain 20 formed on a semiconductor substrate. Semiconductor device 1 includes transistors or other circuit elements (described later) that are formed on a surface of a semiconductor material or an insulating material or formed in the semiconductor material, and thereby has a function of a predetermined electronic circuit. For example, semiconductor device 1 is an LSI (large scale integration), an IC (integrated circuit), a system LSI, a super LSI, or an ultra LSI.

Domains 10 and 20 are regions to which power supply systems that are mutually different are provided. For example, domain 10 is provided with an analog power supply, and domain 20 is provided with a digital power supply. In other words, domains 10 and 20 are the regions which are connected to the respective power supply systems that are mutually different. To be more specific, domain 10 includes: a plurality of power lines 111 each of which is provided with positive power supply VDD1; and a plurality of ground power lines 112 (first ground power lines) each of which is provided with ground power supply VSS1. Domain 20 includes: a plurality of power lines 121 each of which is provided with positive power supply VDD2; and a plurality of ground power lines 122 (second ground power lines) each of which is provided with ground power supply VSS2.

In each of domains 10 and 20, a plurality of circuit blocks, each of which is formed in a rectangular region called a cell, are connected to form a predetermined circuit (electronic circuit). A circuit (first circuit) formed in domain 10 is connected to power line 111 and ground power line 112, and is thereby provided with (connected to) positive power supply VDD1 and ground power supply VSS1. On the other hand, a circuit (second circuit) formed in domain 20 is connected to power line 121 and ground power line 122, and is thereby provided with (connected to) positive power supply VDD2 and ground power supply VSS2.

Here, the "power supply systems that are mutually different" means that each of the power supplies of the power supply systems is independent. Thus, for example, the power supply of the power supply system provided for domain 10 is separated from the power supply of the power supply system provided for domain 20.

It should be noted that these power supplies only have to be separated at least between domain 10 and domain 20, and that an external connection pad (not illustrated) of semiconductor device 1 may be shared by domain 10 and domain 20.

Moreover, when the power supplies are separated, this includes not only a case where patterns of, for example, lines for supplying the power are completely physically separated (isolated) from each other, but also a case where the patterns are separated electrically through connection via a high-impedance resistance component.

In the present embodiment, domain 10 and domain 20 are connected through a plurality of lines 30. More specifically, the first circuit formed in domain 10 is connected to the second circuit formed in domain 20, through the plurality of lines 30. Thus, a plurality of signals outputted from the first circuit are inputted into the second circuit through the plurality of lines 30.

Figure 2:
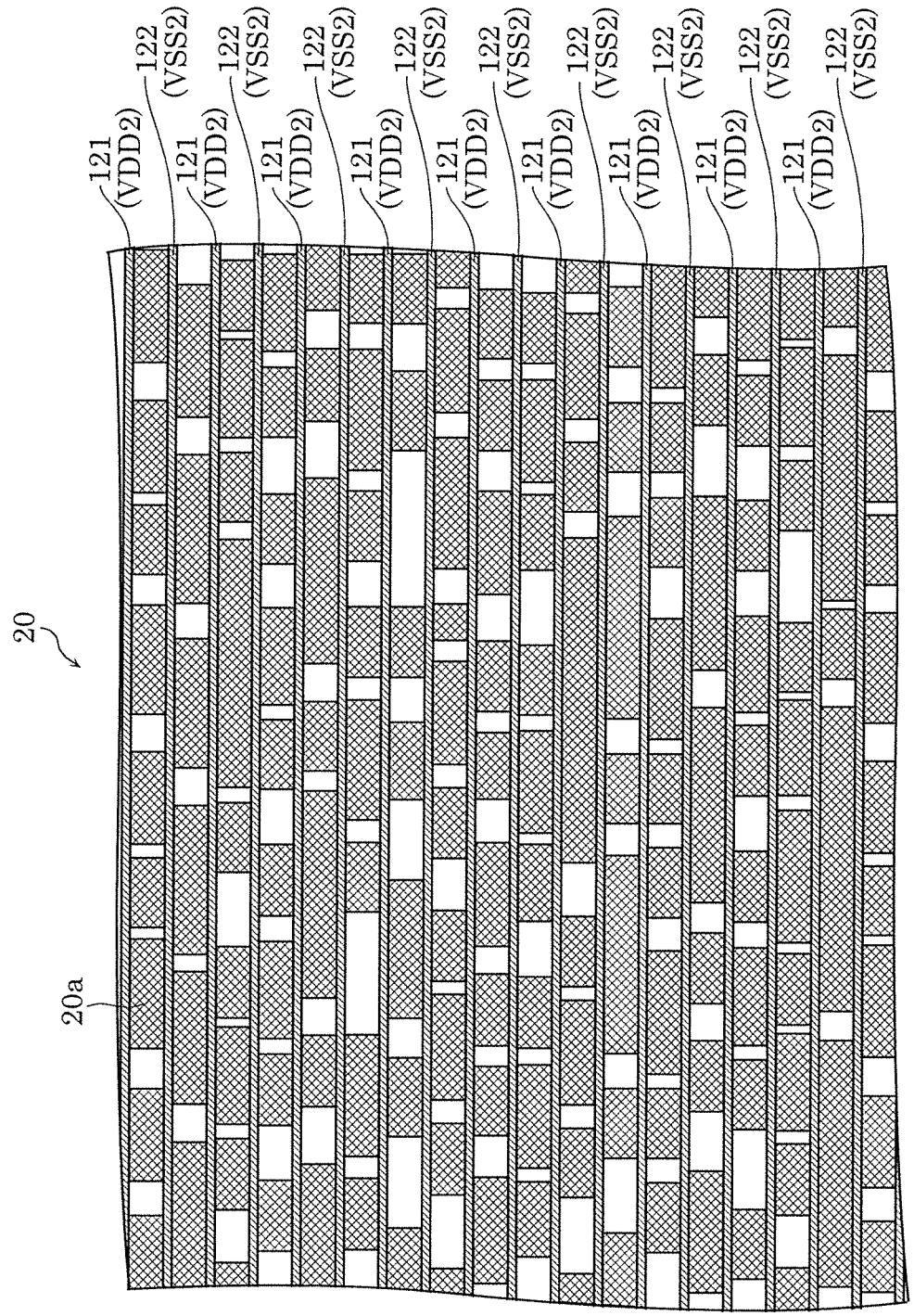
FIG. 2 is a layout diagram showing an arrangement of a domain, according to Embodiment 1.

Next, configurations of domain 10 and domain 20 are specifically described, with reference to FIG. 2. Here, the configurations of domain 10 and domain 20 are nearly identical with each other, except for the circuits formed in the domains (i.e., the first circuit and the second circuit) and a protection cell that is formed in domain 20 as described later. Thus, only the configuration of domain 20 is described below, and a description of the configuration of domain 10 is simplified.

FIG. 2 is a layout diagram showing an arrangement of domain 20. It should be noted that standard cell 20a in FIG. 2 is hatched in a mesh form for the purpose of illustration. Note also that a white region between adjacent standard cells 20a is a blank region in which a circuit block is not disposed.

As shown in FIG. 2, standard cell 20a that is defined in size in a predetermined direction (in a vertical direction in the plane of this diagram) is disposed in domain 20.

Standard cell 20a includes a circuit block that has an arbitrary function by various logic gates formed as the aforementioned circuit elements, such as an inverter, a buffer, NAND, and NOR. Since a plurality of standard cells 20a are connected to one another, the respective circuit blocks formed in these standard cells are connected to one another. With this, a predetermined circuit that implements a predetermined logical function is formed. An arrangement of these standard cells 20a is determined by, for example, an EDA (electronic design automation) that is based on a library provided by a semiconductor manufacturer. The library refers to a database that stores information of data necessary for designing, such as data about electrical characteristics or layout, for each cell height and each logic gate.

As a most basic circuit configuration, a standard cell usually has a CMOS inverter in which an NMOS transistor and a PMOS transistor are connected in series between a VDD line and a VSS line to share a gate. Here, when the VDD lines and the VSS lines are alternately arranged in parallel with each other, a distance between a center of the VDD line and a center of the VSS line is defined. Thus, such a most basic standard cell has a rectangular shape which increases in size in the directions of the VDD line and the VSS line as appropriate according to the circuit size of this standard cell. On this account, the most basic standard cell has a size corresponding to an extending direction of the gate of the CMOS inverter (direction perpendicular to a channel direction) in a direction perpendicular to the VDD line and the VSS line.

To be more specific, as the size in the direction perpendicular to the VDD line and the VSS line (hereinafter, this size referred to as a cell height), there are about three different standardized sizes, for example. Each of the cell heights of the standard cells in the entire semiconductor device may be defined according to a different standardized size. However, the cell heights of the standard cells included in the same circuit need to be defined according to the same standardized size because, for example, the same design rule of micromachining is applied.

Thus, as shown in FIG. 2, a plurality of standard cells 20a having the same cell height and various cell widths are disposed along the extending direction of power line 121 and ground power line 122 in domain 20.

Here, a signal outputted from the first circuit formed in domain 10 is inputted into the second circuit formed in domain 20, as described above. In this case, when a surge occurring at the first circuit is inputted into the second circuit, the second circuit is likely to be destroyed.

In view of this, a protection cell in which a protection circuit described later is formed is provided, according to the present embodiment. With this, the second circuit is protected from the surge occurring between the signals of domains 10 and 20 that are of different power supply systems, and destruction of the second circuit is thereby reduced.

Figure 3:
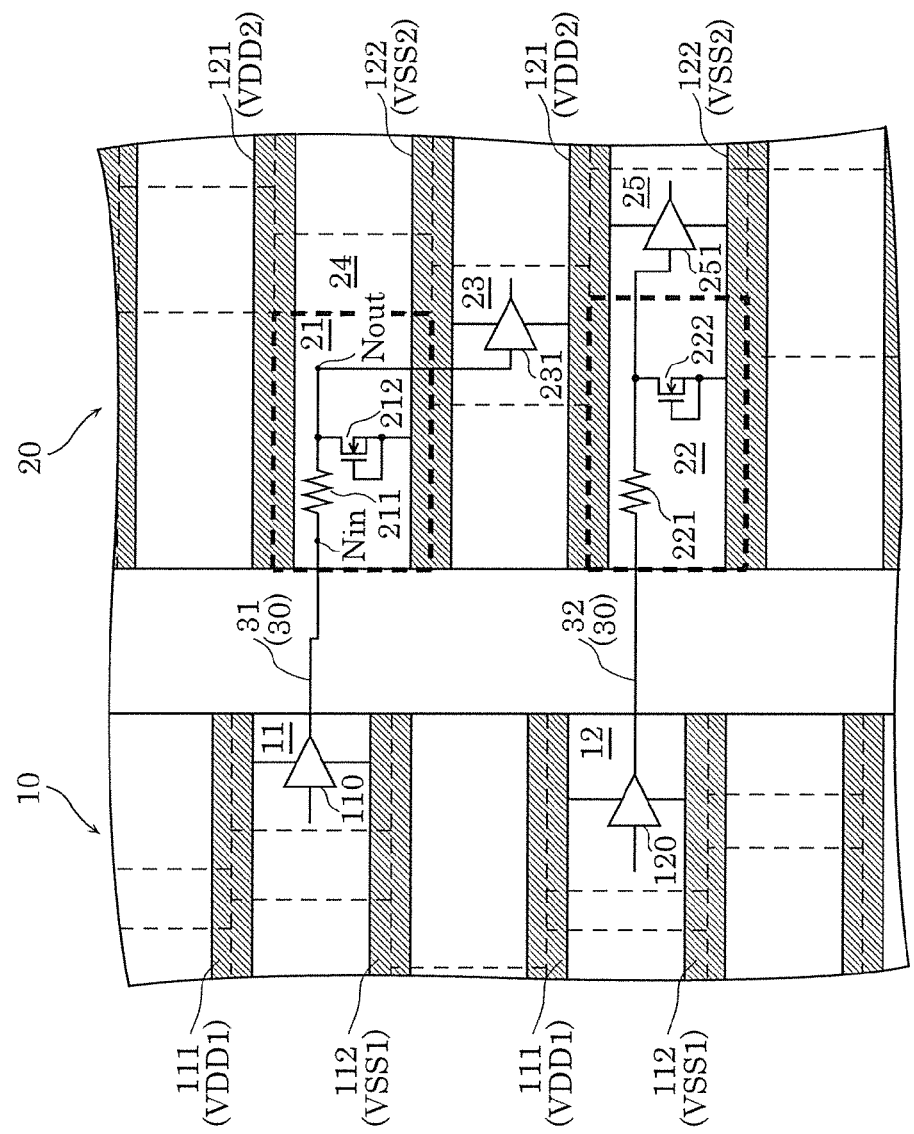
FIG. 3 is a partially enlarged view of FIG. 1, and is a schematic layout diagram showing an enlarged connection part between domains.

FIG. 3 is a partially enlarged view of FIG. 1, and is a schematic layout diagram showing an enlarged connection part between domain 10 and domain 20. In FIG. 3, a broken line indicates a cell boundary in domains 10 and 20. Moreover, a region indicated by a thick broken line indicates a protection cell, and the other regions are the standard cell and the aforementioned blank region. In each of schematic layout diagrams described below, the cell boundary is indicated by a broken line, the protection cell is indicated by a region surrounded by a thick broken line, and the standard cell and the blank region are indicated as the other regions.

As shown in FIG. 3, domain 10 includes: standard cell 11 in which buffer 110 of the first circuit is formed; and standard cell 12 in which buffer 120 of the first circuit is formed. On the other hand, domain 20 includes: protection cells 21 and 22 in each of which a protection circuit is formed; and standard cells 23 to 25 (examples of standard cell 20a shown in FIG. 2) in each of which a buffer of the second circuit is formed. Domains 10 and 20 are connected to each other through the plurality of lines 30.

More specifically, a signal outputted from standard cell 11 (buffer 110) is inputted into standard cell 23 (buffer 231) through line 31 (one of the plurality of lines 30 shown in FIG. 1) and protection cell 21 (protection circuit). Moreover, a signal outputted from standard cell 12 (buffer 120) is inputted into standard cell 25 (buffer 251) through line 32 (another one of the plurality of lines 30) and protection cell 22 (protection circuit). Furthermore, standard cell 24 is disposed adjacent to protection cell 21 and has a buffer that is included in the second circuit.

In other words, the protection circuit is interposed and connected between the first circuit and the second circuit.

Here, a specific configuration of the protection circuit is described. The protection circuit formed in protection cell 21 has the same configuration as the protection circuit formed in protection cell 22. Thus, resistor 211 and protection transistor 212 included in the protection circuit formed in protection cell 21 are described below, and a description of resistor 221 and protection transistor 222 of protection cell 22 is omitted.

Resistor 211 is connected in series between the first circuit formed in domain 10 and the second circuit formed in domain 20, and has a resistance value of 200Ω for example.

Protection transistor 212 is interposed and connected between a node of resistor 211 on the second circuit side and ground power line 122. Protection transistor 212 is an example of a protector that clamps a potential difference between this node and ground power line 122 to a predetermined voltage or lower. Protection transistor 212 is a diode-connected MOS (metal-oxide-semiconductor) transistor, for example.

With this configuration, the protection circuit formed in protection cell 21 can protect the second circuit from a surge occurring at the first circuit.

To be more specific, since a gate and a source of protection transistor 212 are short-circuited, protection transistor 212 is turned off in a normal state in which a voltage inputted into an input node Nin from the first circuit through line 31 is within a predetermined range. However, when a surge voltage that is much larger than a voltage within the predetermined range is applied to input node Nin, a p-n junction between a drain of protection transistor 212 and the substrate is reverse-biased and a breakdown thereby occurs.

As a result, a parasitic bipolar transistor having the semiconductor substrate as a base is turned on. This causes the surge voltage applied to the drain is discharged to ground power line 122 through the parasitic bipolar transistor.

With this, a potential difference between output node Nout of the protection circuit and ground power line 122 is clamped to a predetermined voltage or lower. More specifically, the protection circuit can reduce destruction of the second circuit that is caused by the surge voltage input into the second circuit.

Furthermore, as shown in FIG. 2 and FIG. 3, semiconductor device 1 includes the plurality of power lines 121 and the plurality of ground power lines 122 which are alternately disposed in a direction of cell height (predetermined direction).

Each of the plurality of ground power lines 122 extends linearly in domain 20 (predetermined region) in a direction perpendicular to the direction of cell height, at a boundary between standard cells 20*a* adjacent in the direction of cell height (predetermined direction). Ground power line 122 is shared by the protection circuit and the second circuit.

Figure 4:
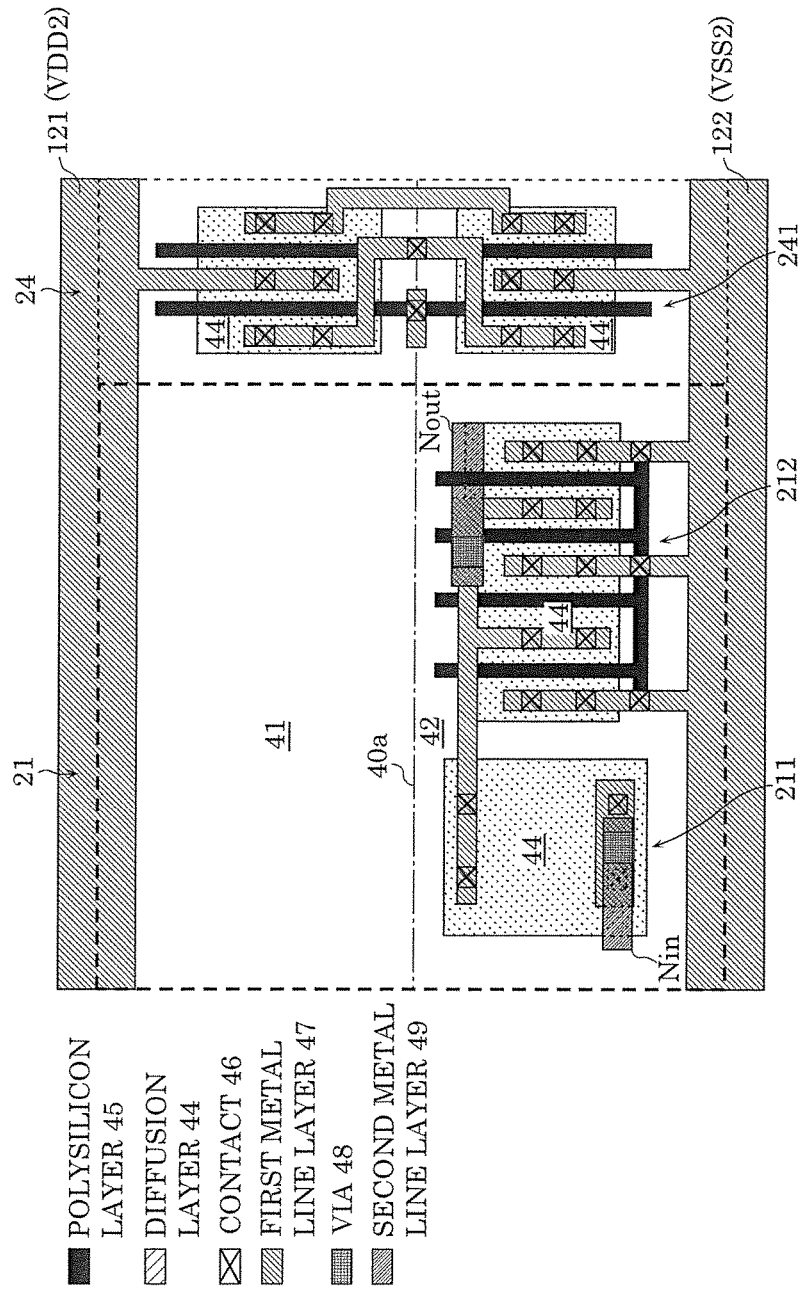
FIG. 4 is a partially enlarged view of FIG. 3, and is a layout diagram showing a detailed layout pattern of a protection cell and a standard cell.

For example, ground power line 122 that provides ground power supply VSS2 to the protection circuit formed in protection cell 21 also provides ground power supply VSS2 to the buffer that is included in the second circuit and formed in standard cell 24 (see FIG. 4). In other words, this ground power line 122 is shared by the protection circuit and the second circuit.

As with the plurality of ground power lines 122, each of the plurality of power lines 121 extends linearly in domain 20 (predetermined region) along the direction perpendicular to the direction of cell height. Moreover, power line 121 is shared by the protection circuit and the second circuit.

To be more specific, the protection circuit is formed in protection cells 21 and 22 each of which is disposed in domain 20 and has a cell height (size in a predetermined direction) that is an integer multiple of the cell height of standard cells 23 to 24 (examples of standard cell 20*a* shown in FIG. 2).

Here, the cell height corresponds to a distance between the center lines of power line 121 and ground power line 122 connected to the circuit block formed in the present cell. In other words, the cell height of each of protection cells 21 and 22 is equal to the cell height of each of standard cells 23 to 24 (the cell height of each of standard cells 23 to 24 is multiplied by one), according to the present embodiment. This cell height can be estimated from, for example, a distance between power line 121 and ground power line 122 or a distance between well boundaries described later.

The plurality of power lines 121 and the plurality of ground power lines 122 are formed in one and the same line layer (first metal line layer described later) in domain 20 (predetermined region), and have nearly the same line width in domain 20 (predetermined region). Here, when the line widths are "nearly the same", this means that the line widths only have to be substantially the same. For example, a difference between a maximum line width and a minimum line width may be 10% of a mean line width or less, or more preferably, 5% of the mean line width or less.

Figure 5:
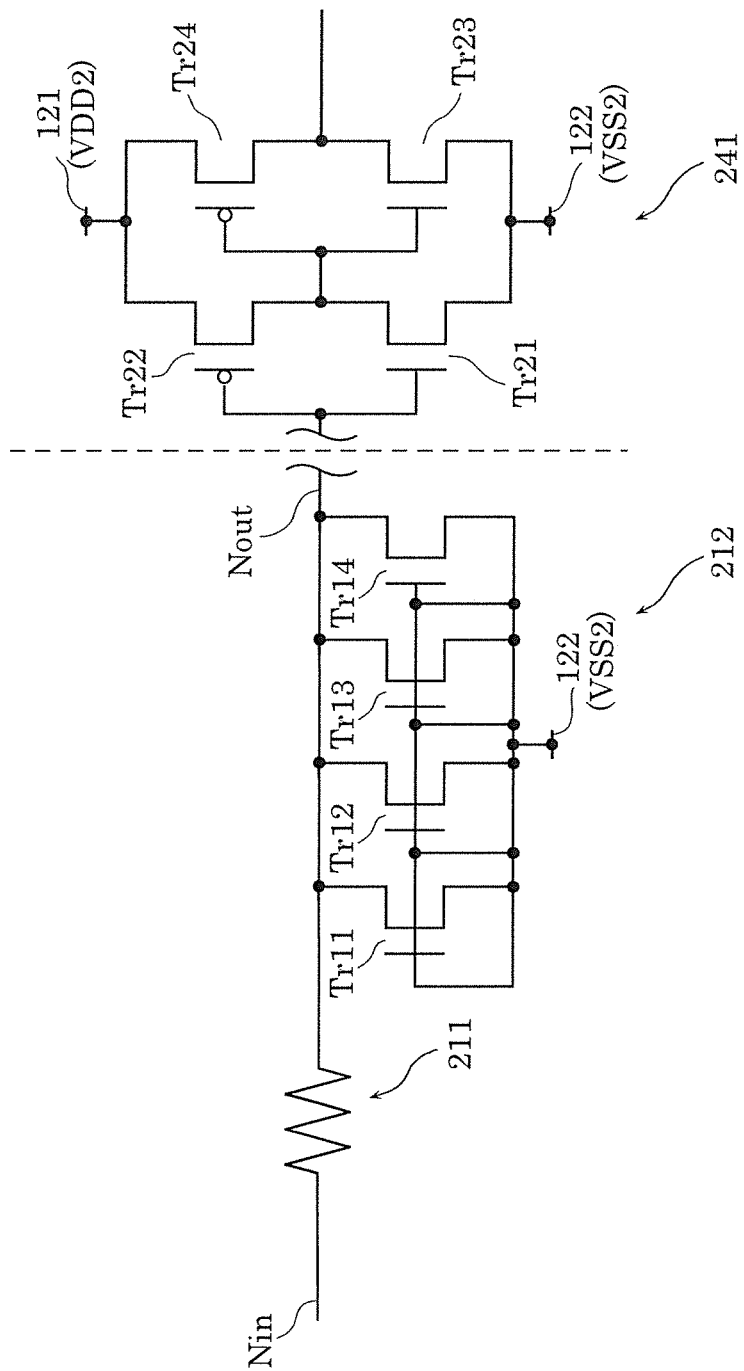
FIG. 5 is a circuit diagram of a configuration shown in FIG. 4.
Figure 6:
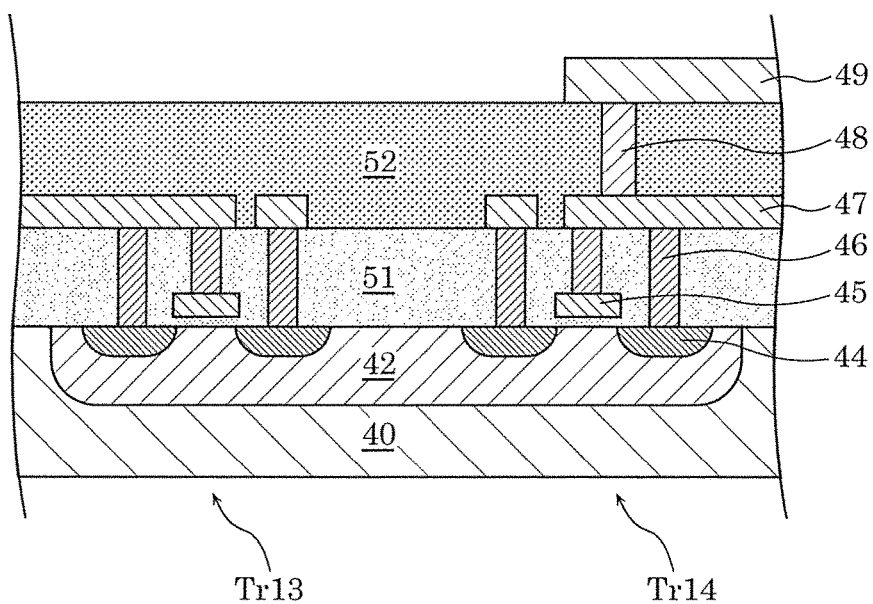
FIG. 6 is a diagram showing a positional relationship among layers of the semiconductor device in a thickness direction, according to Embodiment 1.

Next, layouts of protection cells 21 and 22 are described, with reference to FIG. 4 to FIG. 6. Here, inside layouts of protection cells 21 and 22 are the same. Thus, only protection cell 21 is described below, and a description of protection cell 22 is omitted.

FIG. 4 is a partially enlarged view of FIG. 3, and is a layout diagram showing a detailed layout pattern of protection cell 21 and standard cell 24. FIG. 5 is a circuit diagram of a configuration shown in FIG. 4

Before a description with reference to FIG. 4 and FIG. 5, to facilitate the understanding of layers shown in FIG. 4 (diffusion layer 44, polysilicon layer 45, contact 46, first metal line layer 47, via 48, and second metal line layer 49), a positional relationship among the layers in a thickness direction is described with reference to FIG. 6. FIG. 6 is a diagram showing the positional relationship among the layers of semiconductor device 1 in the thickness direction. It should be noted that since FIG. 6 is shown for convenience of description of the positional relationship among the layers in the thickness direction, FIG. 6 may not be consistent with FIG. 4 except for the positional relationship among the layers in the thickness direction. For example, a gate insulating film may be interposed between polysilicon layer 45 and P-well 42 (semiconductor substrate 40), and an etching stopper layer may be interposed between contact 46 and diffusion layer 44 (semiconductor substrate 40). However, such gate insulating film and such etching stopper layer are not illustrated.

FIG. 6 shows, as an example, configurations of transistors Tr13 and Tr14 shown in FIG. 5.

As shown in FIG. 4 and FIG. 6, semiconductor device 1 according to the present embodiment includes: semiconductor substrate 40 that is, for example, a p-type silicon substrate; N-well 41 and P-well 42 that are formed in semiconductor substrate 40; diffusion layer 44 that is formed in N-well 41 and P-well 42; polysilicon layer 45 that is formed above semiconductor substrate 40; contact 46 that passes through interlayer insulating film 51; first metal line layer 47 that is disposed on interlayer insulating film 51 and connected to contact 46; via 48 that passes through interlayer insulating film 52 disposed on interlayer insulating film 51; and second metal line layer 49 that is disposed on interlayer insulating film 52 and connected to via 48.

Here, diffusion layer 44 formed in N-well 41 and diffusion layer 44 formed in P-well 42 are hatched in the same manner in FIG. 4, for the sake of simplicity. However, P-type diffusion layer 44 is formed in N-well 41 and N-type diffusion layer 44 is formed in P-well 42. To be more specific, a PMOS transistor is formed in N-well 41, and an NMOS transistor is formed in P-well 42, in plan view.

As described above, standard cell 24 has, as the most basic circuit configuration, CMOS buffer 241 in which NMOS transistors Tr21 and Tr23 and PMOS transistors Tr22 and Tr24 are connected in series between power line 121 and ground power line 122 as shown in FIG. 4 and FIG. 5. Thus, each of N-well 41 and P-well 42 is formed in the shape of a strip along the direction perpendicular to the direction of cell height in domain 20, according to the present embodiment. In other words, N-well 41 and P-well 42 are disposed continuously between protection cell 21 and standard cell 24. More specifically, well boundary 40a that is a boundary between N-well 41 and P-well 42 is linear in plan view.

In the present embodiment, the configuration of a two-stage CMOS inverter is described as CMOS buffer 241 formed in standard cell 24. Note, however, that the number of stages of the CMOS inverter may be one or more.

Hereinafter, a layout of protection cell 21 is described with reference to FIG. 4 and FIG. 5.

As shown in FIG. 4, resistor 211 is a resistance that is formed from diffusion layer 44 formed in semiconductor substrate 40 (hereinafter, this resistance is referred to as a diffusion resistance).

From an experiment performed by the inventors, the diffusion resistance has a maximum allowable current value that is at least 10 times larger than a maximum allowable current value of a resistance formed from polysilicon layer 45 (hereinafter, this resistance is referred to as a polysilicon resistance). This means that the use of the diffusion resistance can achieve a resistance thinner in width and smaller in area and allows a distance from an adjacent diffusion region or a pattern of polysilicon layer 45 to be reduced. From this result, it has been found that the whole of protection cell 21 can be implemented by about one fifth as much area as when the polysilicon resistance is used.

Since resistor 211 is formed from the diffusion resistance in this way, the cell height of protection cell 21 can be the same as the cell height of adjacent standard cell 24. More specifically, protection cell 21 can be manufactured by a manufacturing process of standard cell 24.

Protection transistor 212 is formed from polysilicon layer 45, diffusion layer 44, first metal line layer 47, and contact 46. To be more specific, protection transistor 212 includes four transistors Tr11 to Tr14 that are connected in parallel, as shown in FIG. 5. Each of transistors Tr11 to Tr14 is diode-connected, and is an n-type MOSFET (metal oxide semiconductor field-effect transistor). Among four transistors Tr11 to Tr14, transistors adjacent to each other in plan view share a source and a drain.

With this configuration, a signal inputted from the first circuit into protection cell 21 is transmitted from input node Nin formed in second metal line layer 49 to one end of the diffusion resistance forming the resistor 211, sequentially through via 48, first metal line layer 47, and contact 46. Then, the signal is transmitted from the other end of the diffusion resistance to output node Nout, through contact 46, first metal line layer 47, and via 48.

With this, even when a large number of protection cells 21 and 22 are interposed between domain 10 and domain 20 that are different power supply domains, the use of the diffusion resistance as resistor 211 allows a layout to be achieved in a small area in which protection cells 21 and 22 can even be disposed together with standard cells 24 and 25 (standard cell 20a).

To be more specific, a large number of standard cells 20a are used to achieve design automation for the first circuit and the second circuit which are internal circuits. Moreover, the protection circuit may be disposed, for example, relatively close to the second circuit that is a protection target. On this account, protection cells 21 and 22 may be disposed, for example, easily with respect to standard cell 20a (i.e., may have a higher positional affinity).

On the other hand, the protection circuit according to the present embodiment is interposed and connected between the first circuit and the second circuit. In addition, the protection circuit is formed in protection cells 21 and 22 each of which is disposed in domain 20 (predetermined region) and each of which has a cell height (size in a predetermined direction) that is an integer multiple of the cell height of each of standard cells 24 and 25 (standard cell 20a) (in the present embodiment, the cell height is multiplied by one).

With this, the shape of each of protection cells 21 and 22 can be the same as the shape of each of standard cells 24 and 25 (standard cell 20a). Thus, a higher positional affinity can be achieved between protection cells 21 and 22 and standard cells 24 and 25 (standard cell 20a) included in the second circuit. The protection circuit and the second circuit can be therefore disposed relatively close to each other. Hence, the second circuit can be protected from a surge occurring between domain 10 and domain 20 that are different power supply domains. Moreover, the high positional affinity between protection cells 21 and 22 and standard cells 24 and 25 (standard cell 20a) allows the layout to be implemented in a small area. To be more specific, according to the present embodiment, while the second circuit (internal circuit) is protected from a surge occurring between domain 10 and domain 20 that are different power supply systems, miniaturization can also be achieved.

Furthermore, to achieve micromachining in the manufacturing process of semiconductor device 1, a layout rule may be adopted for polysilicon layer 45 included in semiconductor device 1 to limit each of the following to one or a few kinds: an extending direction of polysilicon layer 45; a width of polysilicon layer 45; and a distance to another polysilicon layer 45. In other words, layout flexibility of polysilicon layer 45 may be limited. In this case, when resistor 211 in the protection circuit is formed from a polysilicon resistance, the area of the protection circuit is likely to be large since the layout flexibility of polysilicon layer 45 is low.

In particular, in recent years, combined with increasingly complex circuit specifications, the number of positions where a protection circuit is applicable tends to increase. Thus, an increase in the area of the protection circuit can present a significant challenge in proceeding miniaturization of semiconductor device 1 as a whole On the other hand, since resistor 211 is formed from diffusion layer 44 formed in semiconductor substrate 40 in the present embodiment, the area of resistor 212 in plan view can be reduced. This means that the areas of protection cells 21 and 22 can also be reduced. Thus, even when the areas of standard cells 24 and 25 (standard cell 20a) are reduced to achieve micromachining in the manufacturing process, the aforementioned positional affinity can be increased.

Furthermore, semiconductor device 1 according to the present embodiment includes the protection circuit which has the protection transistor (protection transistor 212 of protection cell 21 and protection transistor 222 of protection cell 22) as the protector. This protector is interposed and connected between the node of the resistor (resistor 211 of protection cell 21 and resistor 221 of protection cell 22) on the second circuit side and ground power line 122 (second ground power line). Moreover, the protector clamps the potential difference between the node and ground power line 122 to a predetermined voltage or lower.

Here, assume that VNout>VSS2+ΔV1 is established, where VNout represents the voltage of the node and ΔV1 represents the predetermined voltage. In this case, a breakdown of the protection transistor (protection transistor 212 of protection cell 21 and protection transistor 222 of protection cell 22) allows VNout to be reduced and thereby can protect the second circuit. On the other hand, VNout<VSS2−ΔV2 is established, where ΔV2 represents the predetermined voltage. In this case, a turn-on of the protection transistor (protection transistor 212 of protection cell 21 and protection transistor 222 of protection cell 22) allows VNout to be increased and thereby can protect the second circuit. Therefore, the second circuit can be protected in both cases of positive and negative surge voltages.

EMBODIMENT 2

Figure 7:
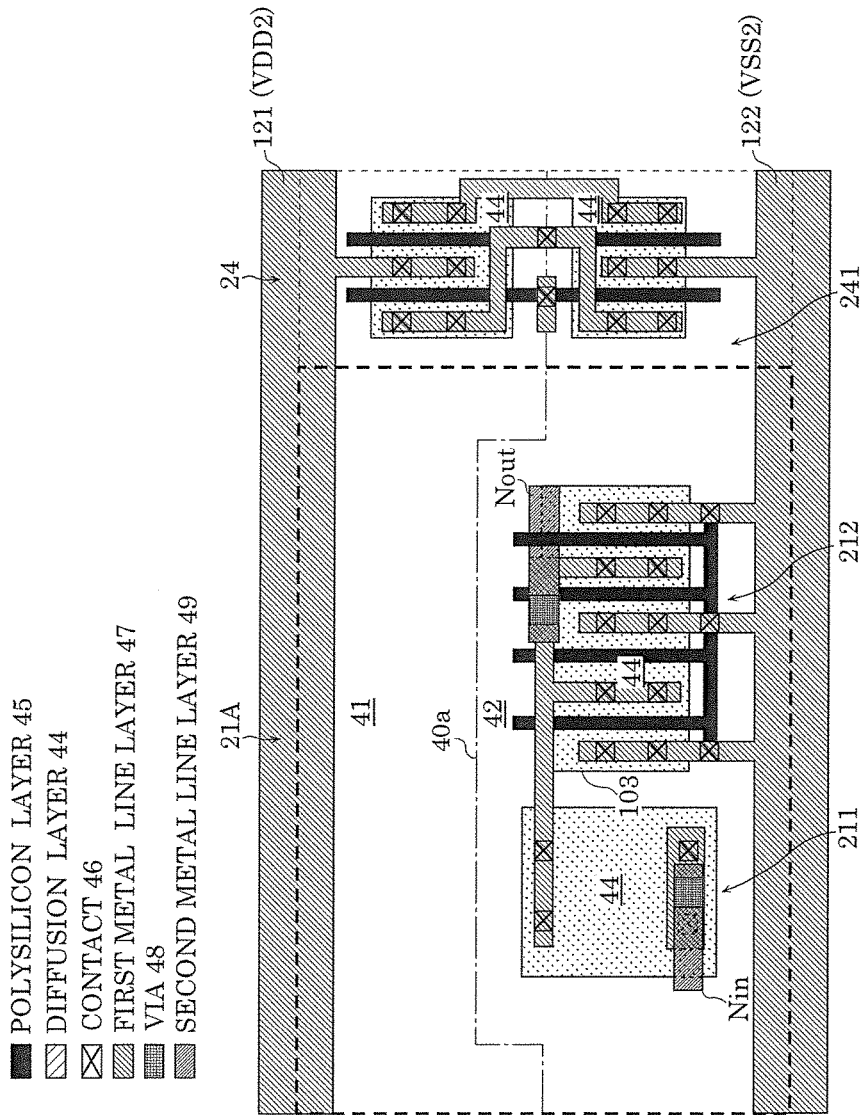
FIG. 7 is a layout diagram showing a detailed layout pattern of a protection cell and a standard cell, according to Embodiment 2.

Next, a configuration of a semiconductor device according to Embodiment 2 is described in detail. FIG. 7 is a layout diagram showing a detailed layout pattern of protection cell 21A and standard cell 24, according to the present embodiment.

As shown in FIG. 7, the present embodiment is different from Embodiment 1 in that well boundary 40a which is a boundary between N-well 41 and P-well 42 is flexed in protection cell 21A in plan view.

In the present embodiment, a protection circuit is disposed in a region in which well boundary 40a is flexed. To be more specific, the protection circuit is disposed in one of N-well 41 and P-well 42 that is larger in area in plan view.

More specifically, in plan view, a part of well boundary 40a in protection cell 21A protrudes toward the power line 121 side more than well boundary 40a located in standard cell 24, as shown in FIG. 7.

As described above, standard cell 24 usually has, as a most basic circuit configuration, a CMOS buffer that includes an NMOS transistor and a PMOS transistor. Thus, N-well 41 and P-well 42 in standard cell 24 are formed to be equal in area in plan view.

On the other hand, protection cell 21A includes only one of NMOS transistor and PMOS transistor (NMOS transistor in the present embodiment) as protection transistor 212. Thus, a diffusion region and a well for forming the other MOS transistor is not necessary in protection cell 21A.

On this account, in the present embodiment, well boundary 40a is flexed in protection cell 21A in plan view in a manner that the area of the unnecessary well (N-well 41 in the present embodiment) is reduced and that the area of the necessary well (P-well 42 in the present embodiment) is increased. With this, a larger area can be allocated to diffusion layer 44 formed for resistor 211 which is a diffusion resistance.

Even this semiconductor device having the above configuration can achieve the same advantageous effect as Embodiment 1.

Moreover, since well boundary 40a is flexed in protection cell 21A according to the present embodiment, the area in which N-well 41 of protection cell 21A is formed can be reduced in plan view. Hence, the cell height of protection cell 21A can be reduced, and a layout can be achieved in an even smaller area.

More specifically, even when standard cell 24 is more miniaturized, protection cell 21A having the same cell height as standard cell 24 can be implemented while the area of diffusion layer 44 necessary for achieving a resistance value (200Ω, for example) required for resistor 211 is maintained. In other words, protection cell 21A having a high positional affinity for more-miniaturized standard cell 24 can be implemented.

EMBODIMENT 3

Figure 8:
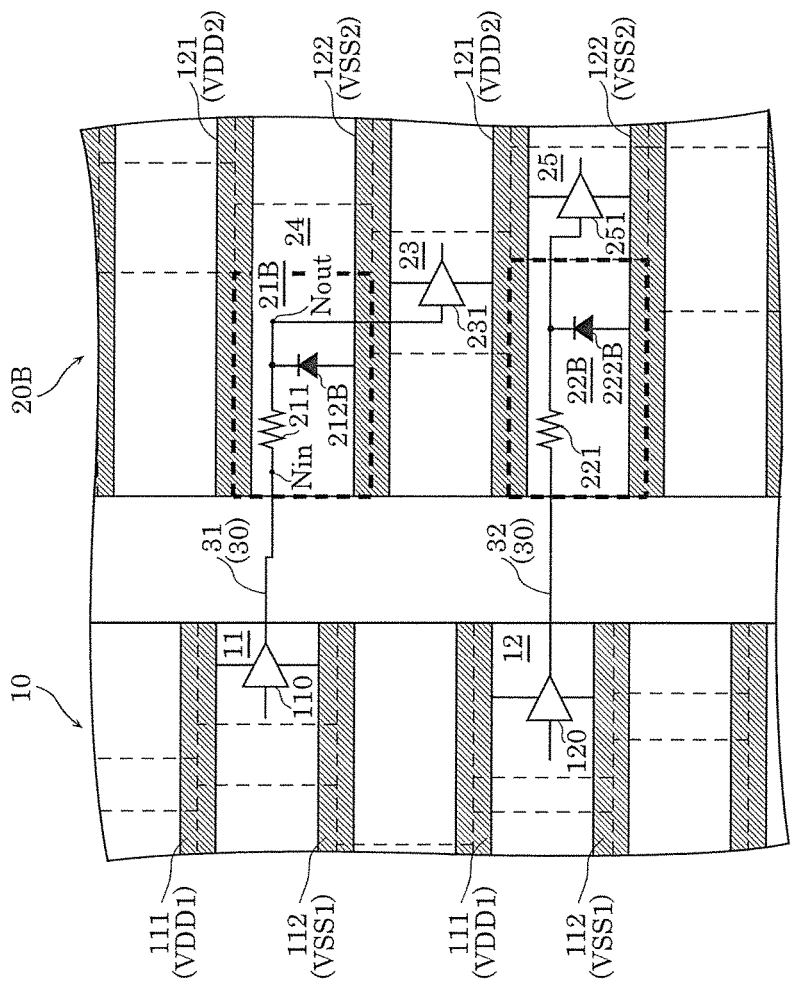
FIG. 8 is a schematic layout diagram showing an enlarged connection part between domains, according to Embodiment 3.

Next, a configuration of a semiconductor device according to Embodiment 3 is described in detail. FIG. 8 is a schematic layout diagram showing an enlarged connection part between domain 10 and domain 20B, according to the present embodiment.

The present embodiment is different from Embodiment 1 in that a protection circuit includes protection diodes 212B and 222B instead of protection transistors 212 and 222. To be more specific, as shown in FIG. 8, the present embodiment is different from Embodiment 1 in that protection cell 21B includes protection diode 212B instead of protection transistor 212, and that protection cell 22B includes protection diode 222B instead of protection transistor 222.

Here, a specific configuration of the protection circuit according to the present embodiment is described. It should be noted that the protection circuit formed in protection cell 21B has the same configuration as the protection circuit formed in protection cell 22B. Thus, resistor 211 and protection diode 212B included in the protection circuit formed in protection cell 21B are described below, and a description of resistor 221 and protection diode 222B of protection cell 22B is omitted.

Protection diode 212B is interposed and connected between a node of resistor 211 on the second circuit side and ground power line 122 (second ground power line). Protection diode 212B is an example of a protector that clamps a potential difference between this node and ground power line 122 to a predetermined voltage or lower. Protection diode 212B includes: an anode that is connected to ground power line 122; and a cathode that is connected to the node of resistor 211 on the second circuit side.

Even with this configuration, the protection circuit formed in protection cell 21B can protect the second circuit from a surge occurring at the first circuit.

To be more specific, protection diode 212B is turned off in a normal state in which a voltage inputted into an input node Nin from the first circuit through line 31 is within a predetermined range. However, when a surge voltage that is beyond the predetermined range and has a low potential (i.e., a negative surge voltage) is applied to input node Nin, protection diode 212B is turned on.

As a result, a potential difference between output node Nout of the protection circuit and ground power line 122 is clamped to the predetermined voltage or lower. More specifically, the protection circuit can reduce destruction of the second circuit that is caused by the surge voltage input into the second circuit.

Figure 9:
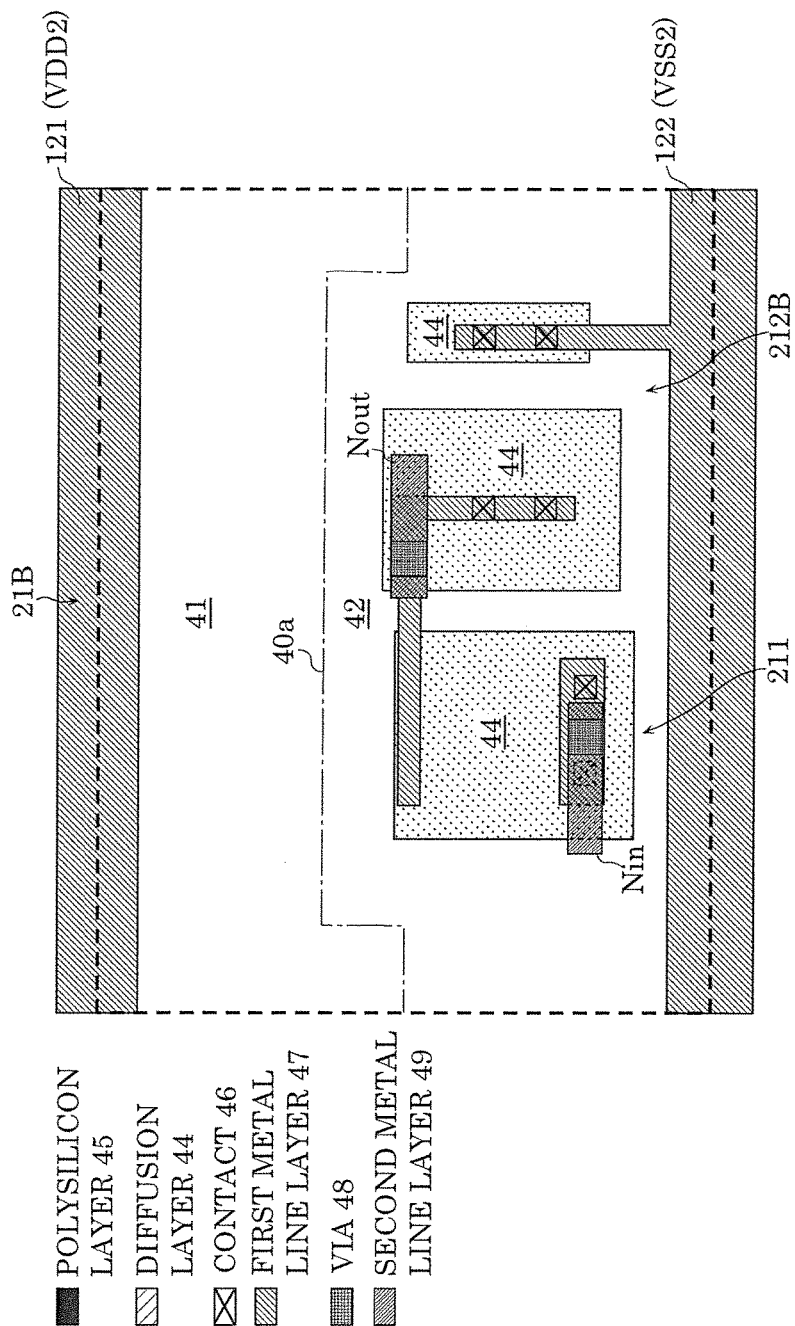
FIG. 9 is a partially enlarged view of FIG. 8, and is a layout diagram showing a detailed layout pattern of a protection cell.

Next, layouts of protection cells 21B and 22B are described, with reference to FIG. 9. Here, inside layouts of protection cells 21B and 22B are the same. Thus, only protection cell 21B is described below, and a description of protection cell 22B is omitted.

FIG. 9 is a partially enlarged view of FIG. 8, and is a layout diagram showing a detailed layout pattern of protection cell 21B.

Protection diode 212B is implemented by a P-N junction between P-well 42 and diffusion layer 44 that is an N-type diffusion layer connected to output node Nout. P-well 42 is connected to diffusion layer 44 that is connected to ground power line 122.

Even this semiconductor device having the above configuration can achieve the same advantageous effect as Embodiment 1.

Furthermore, the protection circuit according to the present embodiment includes the protection diode (protection diode 212B of protection cell 21B and protection diode 222B of protection cell 22B) as the protector. With this, the area of the protector can be reduced in plan view, as compared with the case where a protection transistor is used as the protector. Hence, a layout can be achieved in an even smaller area.

EMBODIMENT 4

Figure 10:
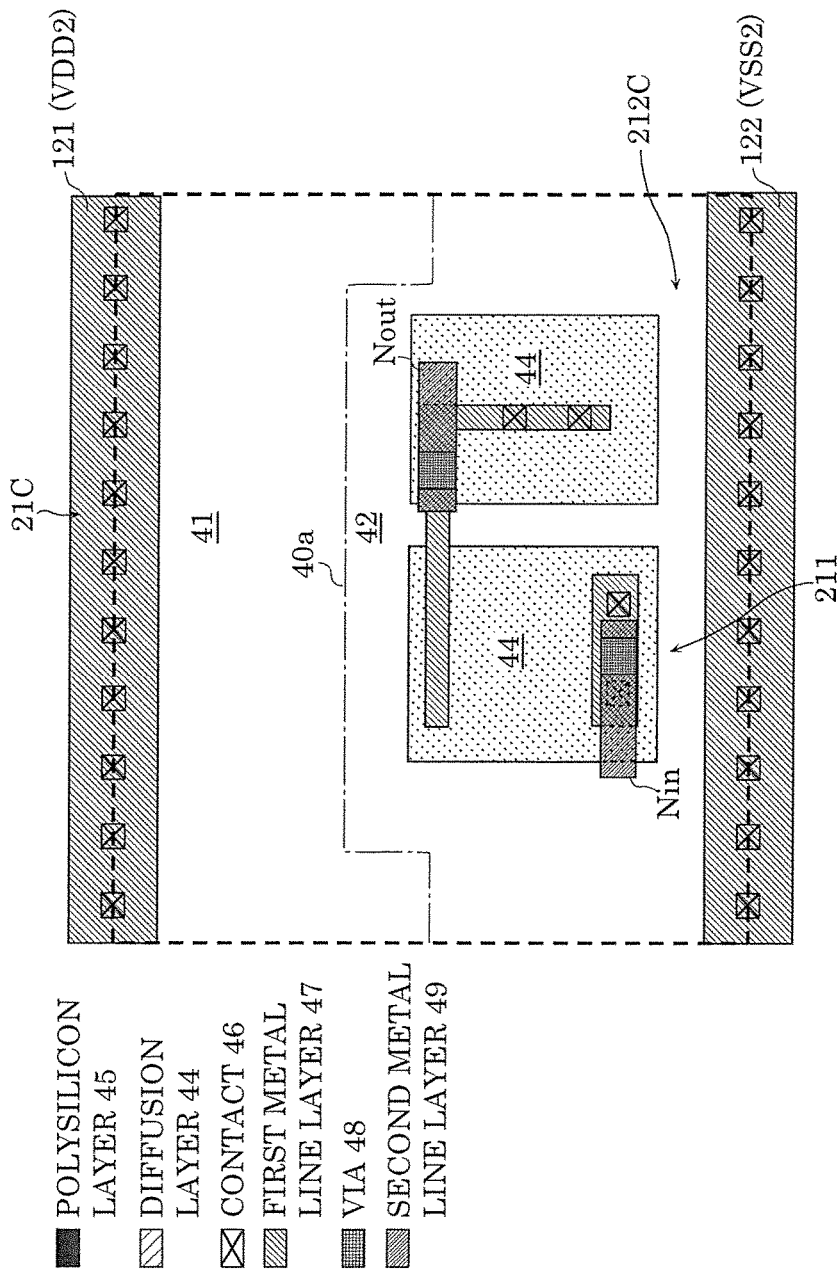
FIG. 10 is a layout diagram showing a detailed layout pattern of a protection cell, according to Embodiment 4.

Next, a configuration of a semiconductor device according to Embodiment 4 is described in detail. FIG. 10 is a layout diagram showing a detailed layout pattern of protection cell 21C, according to the present embodiment.

As shown in FIG. 10, the present embodiment is different from Embodiment 3 in that one of nodes (an anode in the present embodiment) of protection diode 212C is a substrate contact that connects semiconductor substrate 40 and ground power line 122 (second ground power line). To be more specific, this substrate contact connects P-well 42 of semiconductor substrate 40 and ground power line 122.

More specifically, in FIG. 10, a diffusion region (not illustrated) that is connected to ground power line 122 through contact 46 can also serve as the substrate contact that provides ground power supply VSS2 to the anode of protection diode 212C and a whole of P-well 42.

Even with this configuration, the protection circuit formed in protection cell 21C can protect the second circuit from a surge occurring at the first circuit.

Furthermore, one of the nodes of protection diode 212C is the substrate contact (the diffusion region connected to ground power line 122 through contact 46) that connects ground power line 122 and P-well 42, according to the present embodiment. Thus, a layout can be achieved in an even smaller area, as compared with Embodiment 3.

Embodiments 3 and 4 have described only the case where the protection diode is formed in P-well 42 and connected to ground power line 122. However, another protection diode that is formed in N-well 41 and connected to power line 121 may be added to the configuration. With this configuration, a surge protection capability can be enhanced.

More specifically, this configuration allows a potential difference between output node Nout of the protection circuit and power line 121 to be clamped to a predetermined voltage or lower. In other words, regardless of a positive or negative surge voltage, the protection circuit can reduce destruction of the second circuit that is caused by the surge voltage input into the second circuit.

EMBODIMENT 5

Figure 11:
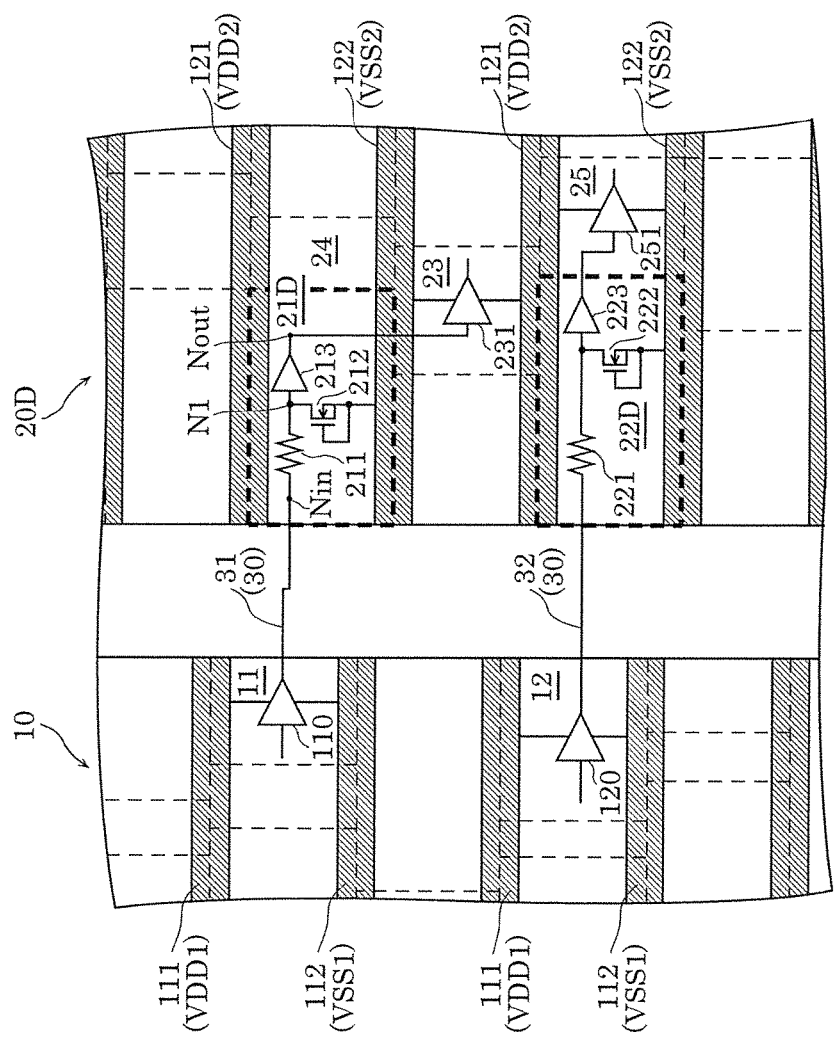
FIG. 11 is a schematic layout diagram showing an enlarged connection part between domains, according to Embodiment 5.
Figure 12:
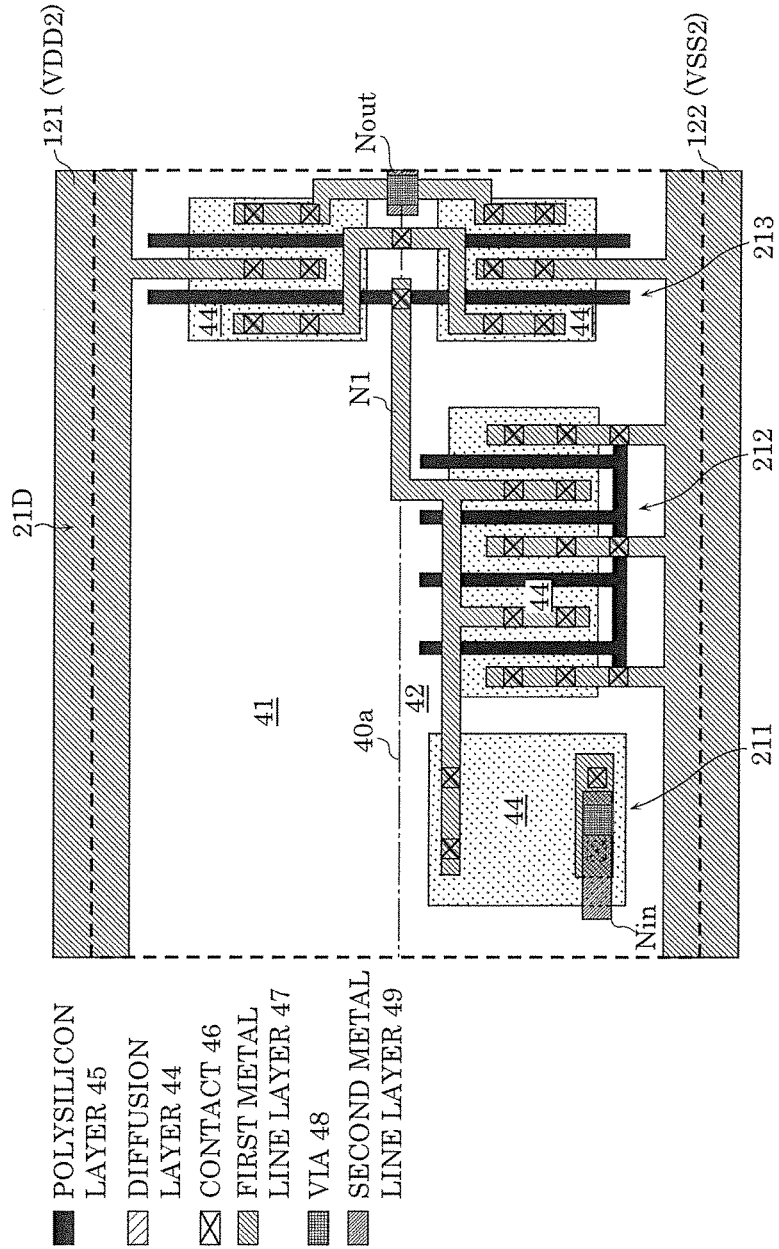
FIG. 12 is a partially enlarged view of FIG. 11, and is a layout diagram showing a detailed layout pattern of a protection cell.

Next, a configuration of a semiconductor device according to Embodiment 5 is described in detail, with reference to FIG. 11 and FIG. 12. FIG. 11 is a schematic layout diagram showing an enlarged connection part between domain 10 and domain 20D, according to the present embodiment. FIG. 12 is a partially enlarged view of FIG. 11, and is a layout diagram showing a detailed layout pattern of protection cell 21D.

Here, a protection circuit formed in protection cell 21D has the same configuration as a protection circuit formed in protection cell 22D. Thus, resistor 211, protection transistor 212, and buffer 213 (described later) included in the protection circuit formed in protection cell 21D are described below, and a description of resistor 221, protection transistor 222, and buffer 223 of protection cell 22B is omitted.

The present embodiment is different from Embodiment 1 in that the semiconductor device further includes an output circuit that is interposed and connected between each of resistors (resistor 211 of protection cell 21D and resistor 221 of protection cell 22D) and the second circuit. To be more specific, the output circuit corresponds to each of buffers 213 and 223 formed in respective protection cells 21D and 22D, according to the present embodiment.

As shown in FIG. 12, a configuration of protection cell 21D according to the present embodiment corresponds to the configuration in which protection cell 21 and standard cell 24 are connected through first metal line layer 47 as in FIG. 4.

Here, a specific configuration of the protection circuit according to the present embodiment is described.

Buffer 213 includes: an input node that is connected to node N1 of resistor 221 on the second circuit side; and an output node that is connected to output node Nout of the protection circuit. With the configuration in which buffer 213 is provided for output node Nout of protection cell 21D, a timing analysis of domain 20 including protection cell 21D can be easily performed.

More specifically, assume that a delay calculation is performed for signals between standard cells using an automatic tool. In this case, when an input and an output of the cell is connected only through a resistance, a delay calculation error is usually increased because an input load capacity varies depending on a state of the output. On the other hand, when the input and the output are connected through buffer 213 as in the present embodiment, the state of the output is less likely to influence the input.

Thus, buffer 213 provided for output node Nout of protection cell 21D allows the delay calculation to be performed with high precision on, for example: a delay time in protection cell 21D; a delay time due to wiring between standard cell 11 and protection cell 21D; and a delay time due to wiring between protection cell 21D and standard cell 23D. More specifically, the same delay calculation method used for the standard cell can be applied to protection cell 21D. As a result, a design margin can be reduced and signal transmission at higher speed can be thereby achieved.

The semiconductor device having the above configuration has a reduced miniaturization effect to a certain extent, as compared with Embodiment 1. However, the design margin can be reduced and the high-speed signal transmission can be thereby achieved.

Furthermore, as shown in FIG. 12, a gate of protection transistor 212 and a gate of CMOS transistor included in buffer 213 in protection cell 21D have shapes that extend in the same direction in plan view. To be more specific, each of gates of four NMOS transistors included in protection transistor 212 and each of gates of two CMOS transistors included in buffer 213 has an elongated shape extending in a direction of cell height (in a vertical direction in the plane of this diagram).

With this, even when a layout rule that limits the extending direction of polysilicon layer 45 to one direction may be adopted, protection cell 21D according to the present embodiment can be manufactured.

EMBODIMENT 6

Figure 13:
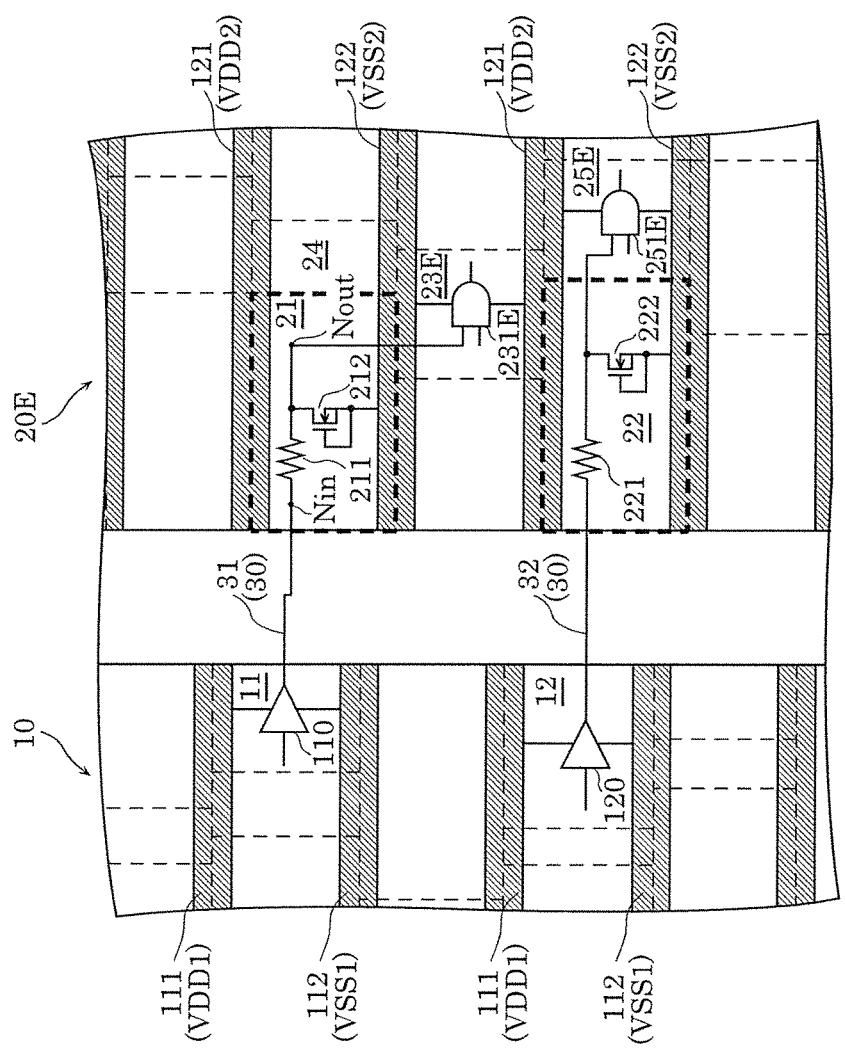
FIG. 13 is a schematic layout diagram showing an enlarged connection part between domains, according to Embodiment 6.

Next, a configuration of a semiconductor device according to Embodiment 6 is described in detail. FIG. 13 is a schematic layout diagram showing an enlarged connection part between domain 10 and domain 20E, according to the present embodiment.

The present embodiment is different from Embodiment 1 in that the semiconductor device further includes an output circuit that is interposed and connected between each of resistors (resistor 211 of protection cell 21D and resistor 221 of protection cell 22D) and the second circuit. To be more specific, the output circuit corresponds to each of logic gates 231E and 251E formed in respective standard cells 23E and 25E, according to the present embodiment.

To be more specific, logic gate 231E that is an AND logic gate is formed in standard cell 23E, and logic gate 251E that is an AND logic gate is formed in standard cell 25E, as shown in FIG. 13. Unlike Embodiment 1, output nodes of protection cells 21 and 22 according to the present embodiment are connected to, instead of standard cells 23 and 25 which include the respective buffers, standard cells 23E and 25E which include the respective logic gates.

Even this semiconductor device having the above configuration can achieve the same advantageous effect as Embodiment 1.

According to the present embodiment, the logic gate (logic gate 231E of standard cell 23E and logic gate 251E of standard cell 25E) is interposed between the resistor (resistor 211 of protection cell 21 and resistor 221 of protection cell 22) and the second circuit. With this, for example, by controlling an input node included in the two input nodes of the logic gate and different from the other input node from the protection cell, a state in which input to the second circuit becomes unsteady during a power shutdown can be avoided.

To be more specific, when the power supply (VDD1 and VSS1) is shut down in domain 10 in which the first circuit is disposed, the voltage of the signal outputted from the first circuit may become unsteady (such as an intermediate potential between VDD1 and VSS1). In this case, when the signal of such an unsteady voltage is inputted into the second circuit, the second circuit is likely to perform an unexpected operation, for example.

With this being the situation, when the power shutdown in domain 10 is detected, a control circuit provides ground power (potential) supply VSS2 to the other input nodes of logic gates 231E and 251E. As a result, output voltages of logic gates 231E and 251E can be ground power supply VSS2. In other words, the voltage to be inputted into the second circuit can be ground power supply VSS2. In this way, the state in which the input to the second circuit becomes unsteady can be avoided.

It should be noted that the logic gate interposed between the resistor and the second circuit may not be an AND logic gate. For example, the logic gate may be an OR logic gate or an inverted AND or OR logic gate. Furthermore, the logic gate may be formed in protection cells 21 and 22 instead of the standard cells.

EMBODIMENT 7

Figure 14:
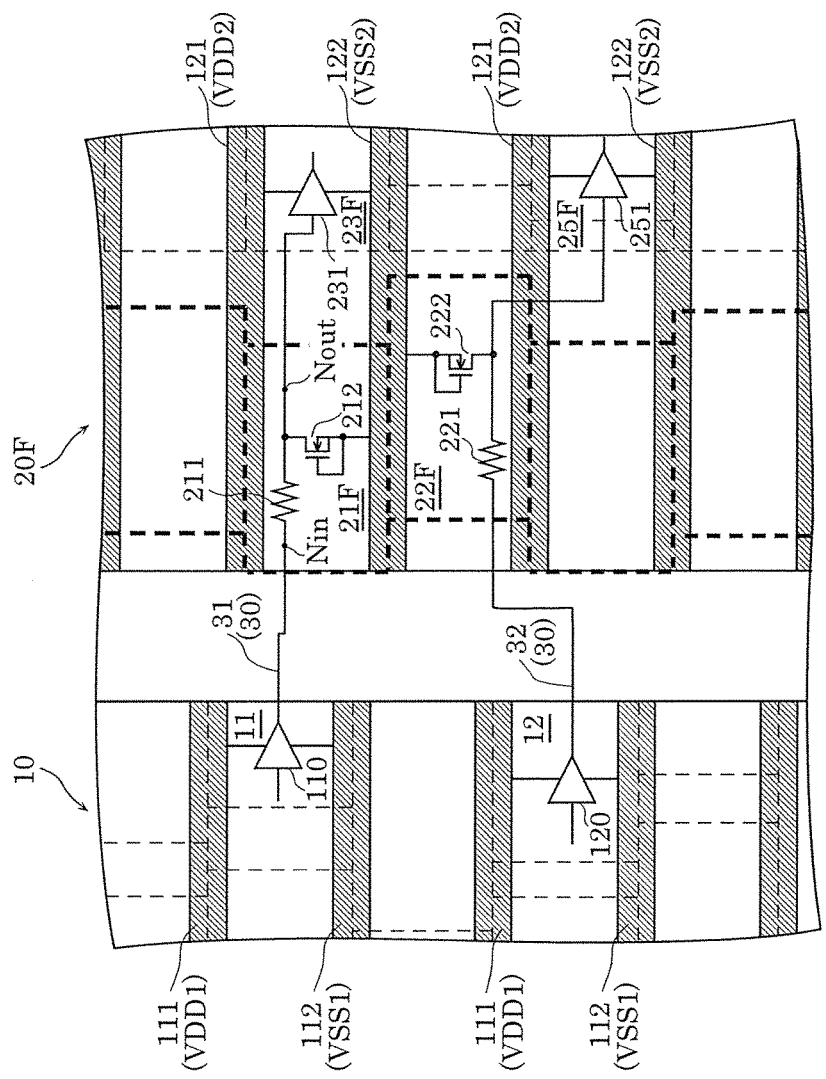
FIG. 14 is a schematic layout diagram showing an enlarged connection part between domains, according to Embodiment 7.
Figure 15:
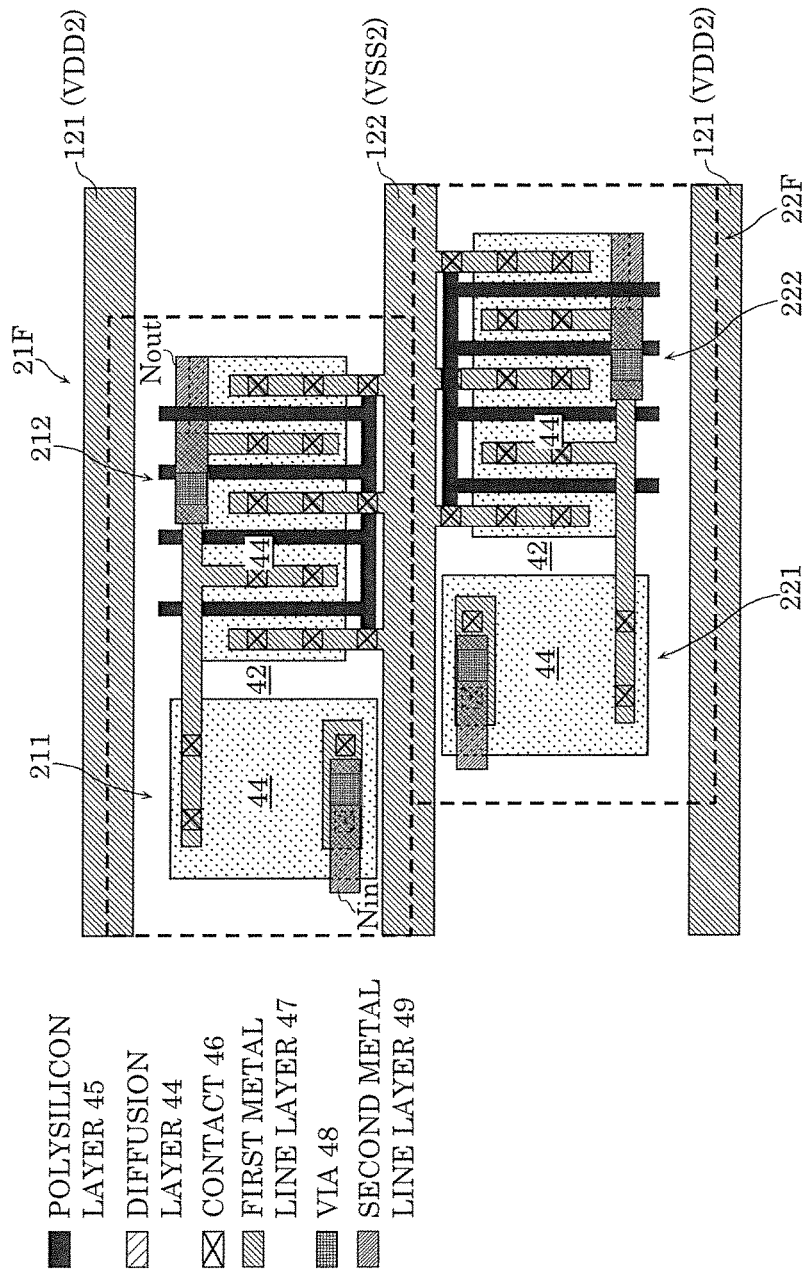
FIG. 15 is a partially enlarged view of FIG. 14, and is a layout diagram showing a detailed layout pattern of adjacent protection cells.

Next, a configuration of a semiconductor device according to Embodiment 7 is described in detail, with reference to FIG. 14 and FIG. 15. FIG. 14 is a schematic layout diagram showing an enlarged connection part between domain 10 and domain 20F, according to the present embodiment. FIG. 15 is a partially enlarged view of FIG. 14, and is a layout diagram showing a detailed layout pattern of protection cells 21F and 22F.

A protection circuit formed in protection cell 21F has the same configuration as a protection circuit formed in protection cell 22F. Thus, the protection circuit formed in protection cell 21F is described below, and a description of protection cell 22F is simplified.

In each of the embodiments described above, a standard cell is interposed between the protection cells. On the other hand, as shown in FIG. 14 and FIG. 15 according to the present embodiment, a plurality of protection cells 21F and 22F in each of which the protection circuit is formed are disposed adjacent to each other in a direction of cell height (predetermined direction).

More specifically, a part of one side of protection cell 21F is in contact with a part of one side of protection cell 22F in the direction of cell height (predetermined direction, i.e., a vertical direction in the plane of this diagram), according to the present embodiment. To be more specific, protection cell 21F and protection cell 22F adjacent to each other share ground power line 122, and have a layout pattern in which these protection cells are symmetrical with respect to ground power line 122.

Even this semiconductor device having the above configuration can achieve the same advantageous effect as Embodiment 1.

According to the present embodiment, protection cells 21F and 22F are disposed adjacent to each other in the direction of cell height (predetermined direction). Thus, the area occupied by protection cells 21F and 22F can be reduced.

Moreover, in each of the embodiments described above, the protection cell and the standard cell are disposed adjacent to each other. On the other hand, although protection cells 21F and 22F share the power line with standard cells 23F and 25F as shown in FIG. 14 and FIG. 15 according to the present embodiment, protection cells 21F and 22F do not need to be adjacent to standard cells 23F and 25F. More specifically, a blank region may be provided between protection cells 21F and 22F and standard cells 23F and 25F.

Assume that protection cells 21F and 22F are disposed adjacent to each other and that the blank region is provided between protection cells 21F and 22F and standard cells 23F and 25F in this way. In this case, N-well 41 that is not necessary for protection cells 21F and 22F is not formed in protection cells 21F and 22F, and P-well 42 that is necessary can be formed fully in protection cells 21F and 22F. Thus, a layout can be achieved in an even smaller area.

Furthermore, protection cell 21F and protection cell 22F are disposed at positions that are mutually different (displaced) in a direction of cell width (direction perpendicular to the predetermined direction). With this, blank regions around protection cell 21F and protection cell 22F can be increased.

When a blank region is smaller, a design flexibility of the semiconductor device is usually reduced. On this account, by increasing the blank regions around protection cell 21F and protection cell 22F according to the present embodiment, a flexibility of arrangement of protection cell 21F and protection cell 22F is also increased. Thus, according to the present embodiment, arrangement positions of protection cell 21F and protection cell 22F can be determined using the EDA, and design man-hours can be thereby reduced.

EMBODIMENT 8

Next, a configuration of a semiconductor device according to Embodiment 8 is described. The present embodiment is different from Embodiment 7 in that a plurality of protection cells are disposed at positions that are mutually the same in a direction of cell width (direction perpendicular to the predetermined direction).

Figure 16:
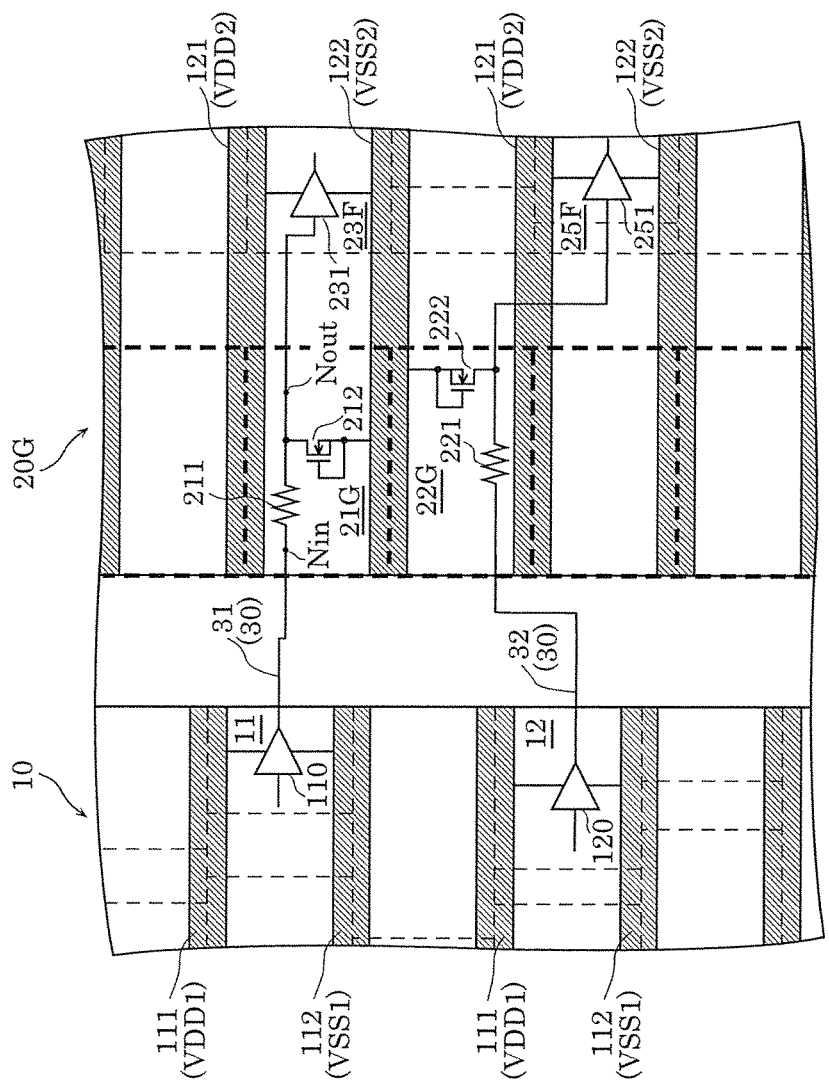
FIG. 16 is a schematic layout diagram showing an enlarged connection part between domains, according to Embodiment 8.
Figure 17:
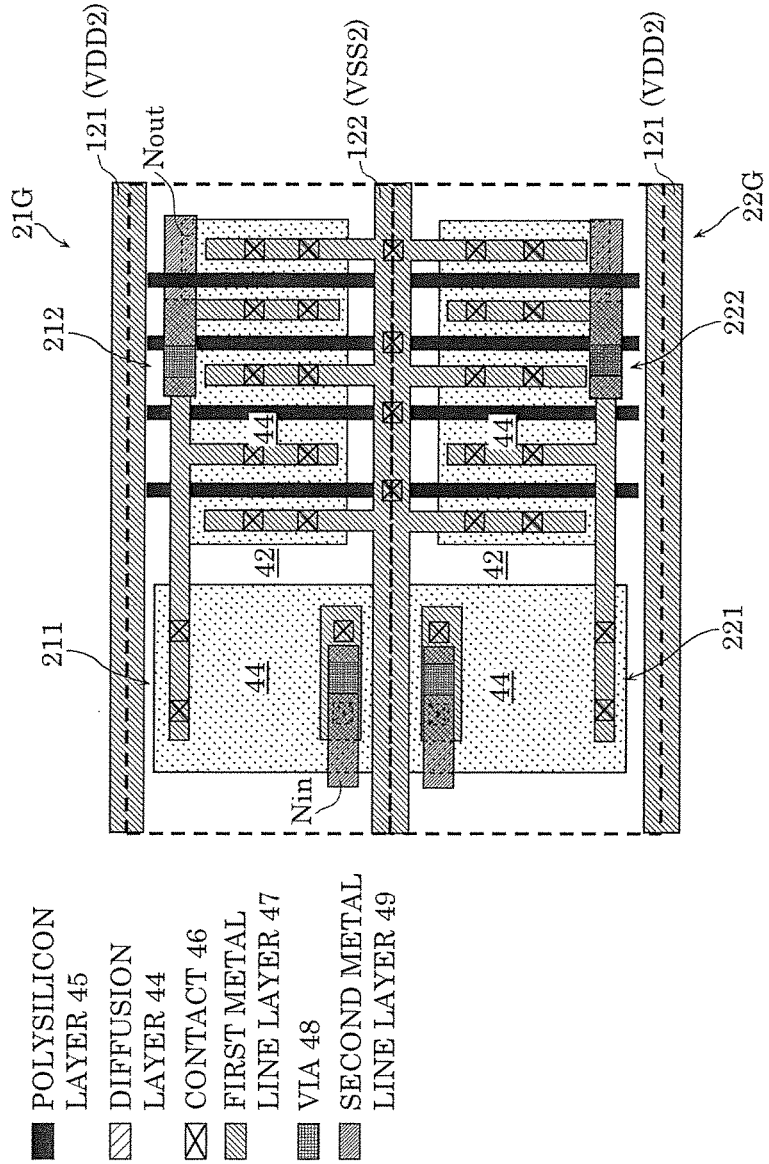
FIG. 17 is a partially enlarged view of FIG. 16, and is a layout diagram showing a detailed layout pattern of adjacent protection cells.

The present embodiment is described below, with reference to FIG. 16 and FIG. 17. FIG. 16 is a schematic layout diagram showing an enlarged connection part between domain 10 and domain 20G, according to the present embodiment. FIG. 17 is a partially enlarged view of FIG. 16, and is a layout diagram showing a detailed layout pattern of protection cells 21G and 22G.

As shown in FIG. 16 and FIG. 17, protection cells 21G and 22G are disposed at the positions that are mutually the same in the direction of cell width (direction perpendicular to the predetermined direction). To be more specific, protection cells 21G and 22G are disposed in a manner that one side of protection cell 21G is perfectly aligned with one side of protection cell 22G. Thus, protection cell 21G and protection cell 22G that are adjacent to each other share ground power line 122, and have a layout pattern in which these protection cells are symmetrical with respect to ground power line 122 at the same position in the direction of cell width.

Even this semiconductor device having the above configuration can achieve the same advantageous effect as Embodiment 1.

Furthermore, protection cell 21G and protection cell 22G are disposed at the positions that are mutually the same (displacement from each other is not allowed) in the direction of cell width (direction perpendicular to the predetermined direction), according to the present embodiment. Thus, a layout can be achieved in an even smaller area, as compared with Embodiment 7.

EMBODIMENT 9

Figure 18:
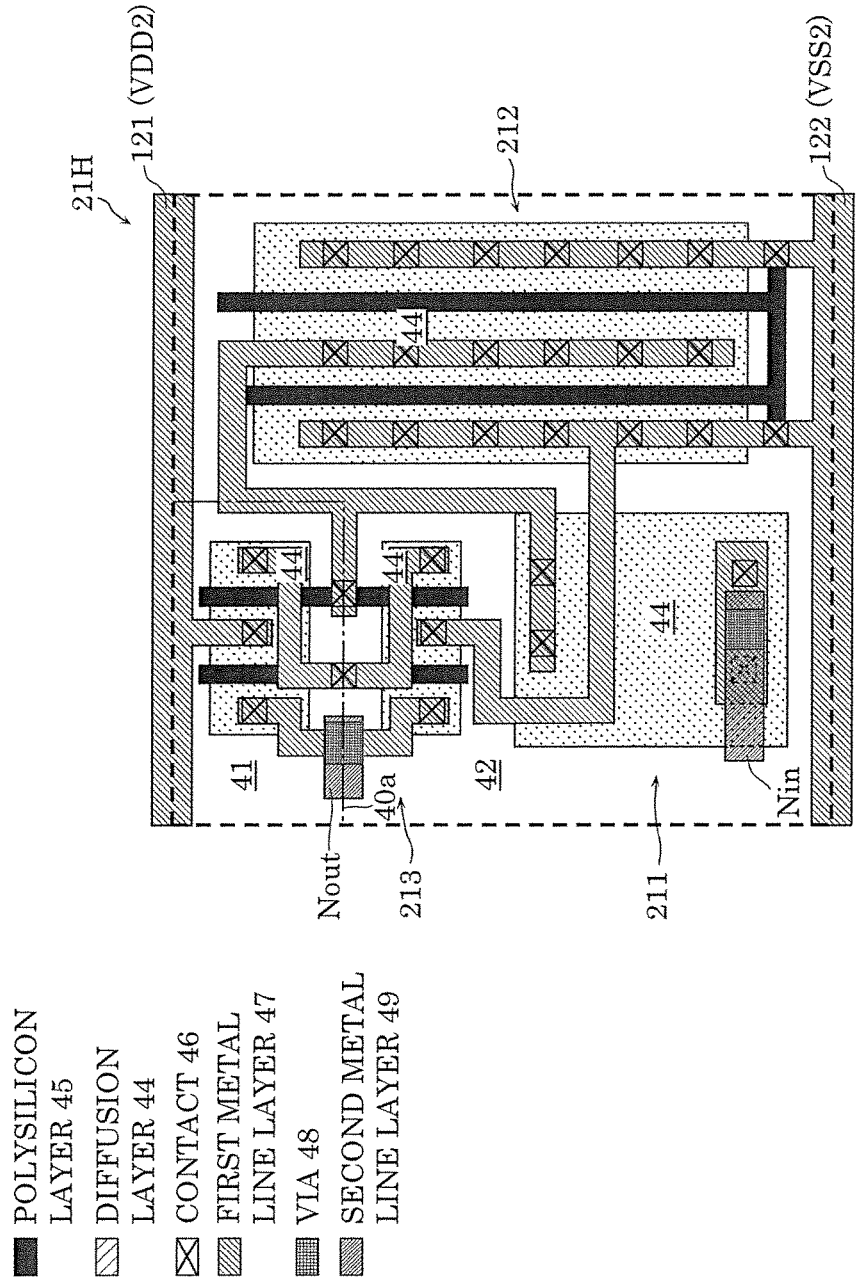
FIG. 18 is a layout diagram showing a detailed layout pattern of a protection cell, according to Embodiment 9.

Next, a configuration of a semiconductor device according to Embodiment 9 is described. FIG. 18 is a layout diagram showing a detailed layout pattern of protection cell 21H, according to the present embodiment.

As with protection cell 21D according to Embodiment 5 (see FIG. 12), protection cell 21H shown in FIG. 18 includes: a protection circuit having resistor 211 and protection transistor 212; and buffer 213. Note that protection cell 21H is different from protection cell 21D in that well boundary 40a in protection cell 21H is bent into an L shape.

To be more specific, well boundary 40a according to the present embodiment is formed in a manner to cut away one of corners of rectangular protection cell 21H in plan view. Thus, in plan view, P-well 42 has a shape in which one of corners of the rectangle is cut away, and N-well 41 is formed in this cut-away portion of P-well 42.

With this, even when protection cell 21H includes buffer 213 according to the present embodiment, a layout can be achieved in a small area as compared with Embodiment 5.

Furthermore, as with Embodiment 8, a plurality of protection cells including protection cell 21H are disposed at positions that are mutually the same (displacement from each other is not allowed) in the direction of cell width (direction perpendicular to the predetermined direction) according to the present embodiment. Thus, a layout can be achieved in an even smaller area.

EMBODIMENT 10

Next, a configuration of a semiconductor device according to Embodiment 10 is described. The present embodiment is different from each of the embodiments described above in that a cell height (size in the predetermined direction) of a protection cell is twice as high as a cell height of a standard cell.

Figure 19:
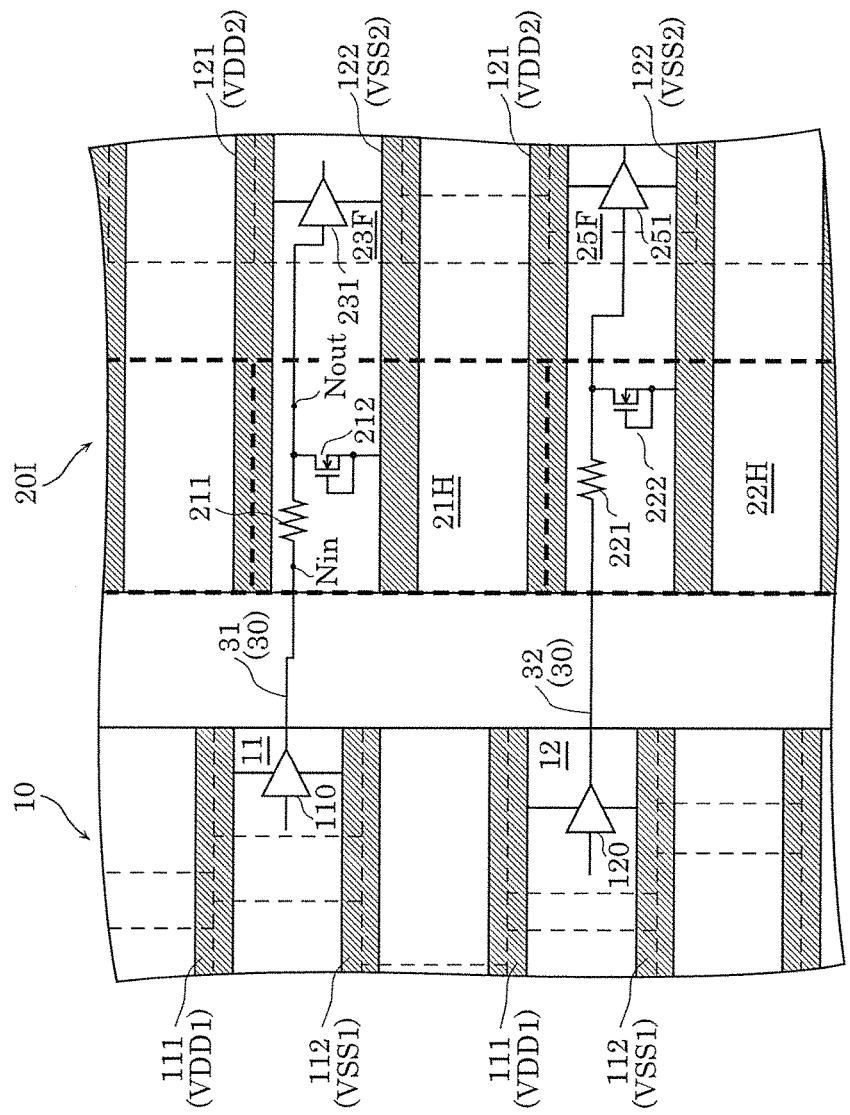
FIG. 19 is a schematic layout diagram showing an enlarged connection part between domains, according to Embodiment 10.
Figure 20:
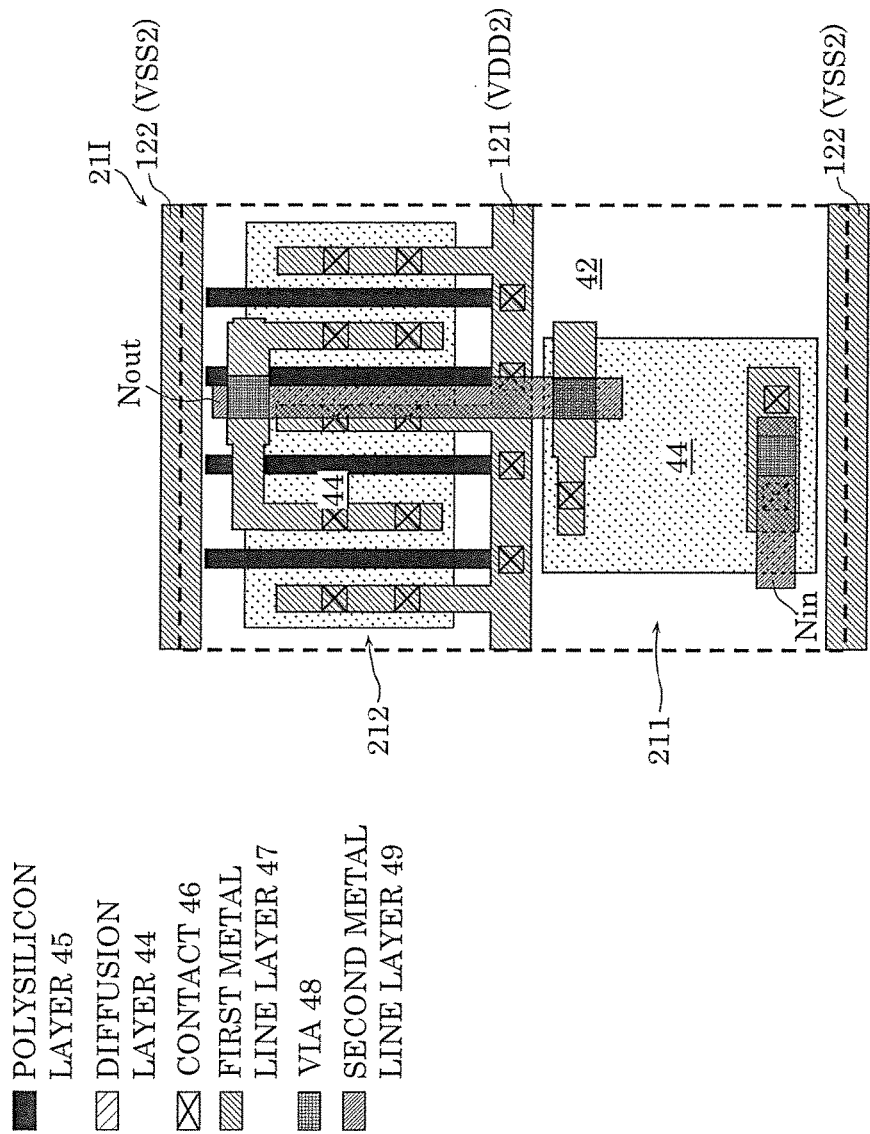
FIG. 20 is a partially enlarged view of FIG. 19, and is a layout diagram showing a detailed layout pattern of a protection cell.

The present embodiment is described in detail below, with reference to FIG. 19 and FIG. 20. FIG. 19 is a schematic layout diagram showing an enlarged connection part between domain 10 and domain 20I, according to the present embodiment. FIG. 20 is a partially enlarged view of FIG. 19, and is a layout diagram showing a detailed layout pattern of protection cell 21I.

A protection circuit formed in protection cell 21I has the same configuration as a protection circuit formed in protection cell 22I. Thus, the protection circuit formed in protection cell 21I is described below, and a description of protection cell 22I is simplified.

As shown in FIG. 19 and FIG. 20, each of protection cells 21I and 22I has a cell height that is twice as high as a cell height of each of standard cells 23F and 25F. Moreover, protection cells 21I and 22I are disposed adjacent to each other. More specifically, as shown in FIG. 20, resistor 211 and protection transistor 212 are disposed along the direction of cell height (vertical direction in the plane of this diagram) in protection cell 21I. With this, resistor 211 and protection transistor 212 are arranged compactly, as compared to the embodiments described above. Thus, a layout can be achieved in an even smaller area, according to the present embodiment.

It should be noted that the cell height (size in the predetermined direction) of each of protection cells 21I and 22I is not limited to twice as high as the cell height of each of standard cells 23F and 25F. The cell height of the protection cell may be three or more integer multiples of the cell height of the standard cell.

EMBODIMENT 11

Figure 21:
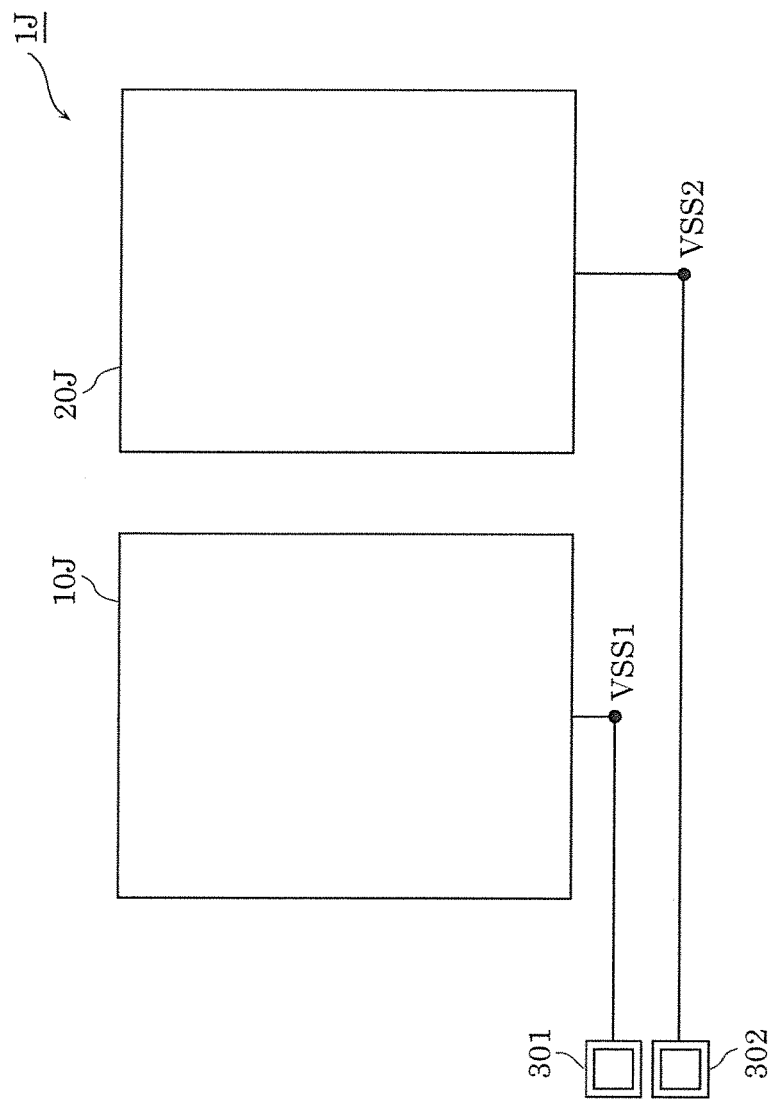
FIG. 21 is a schematic connection diagram of a semiconductor device, according to Embodiment 11.

Next, a configuration of a semiconductor device according to Embodiment 11 is described. FIG. 21 is a schematic connection diagram of semiconductor device 1J, according to the present embodiment. Domain 10J and domain 20J shown in FIG. 21 correspond, respectively, to the domain that includes the first circuit (domain 10 in Embodiment 1, for example) and the domain that includes the second circuit (domain 20 in Embodiment 1, for example) in the embodiments described above.

Each of pads 301 and 302 shown in FIG. 21 is an electrode pad of semiconductor device 1J. For example, each of pads 301 and 302 is connected to a package pin (lead frame: external electrode) of semiconductor device 1J through wire bonding.

As shown in FIG. 21, domain 10J and domain 20J are provided with ground power supplies VSS1 and VSS2, respectively, which are separated up to pads 301 and 302, according to the present embodiment. By applying one of Embodiments 1 to 10 to semiconductor device 1J in which the power supply system is divided up to electrode pads 301 and 302 in this way, a layout can be achieved in a small area while a surge protection capability is enhanced sufficiently.

More specifically, since semiconductor device 1J has one of the configurations described in Embodiments 1 to 10, the present embodiment can achieve the same advantageous effect as Embodiments 1 to 10.

EMBODIMENT 12

Figure 22:
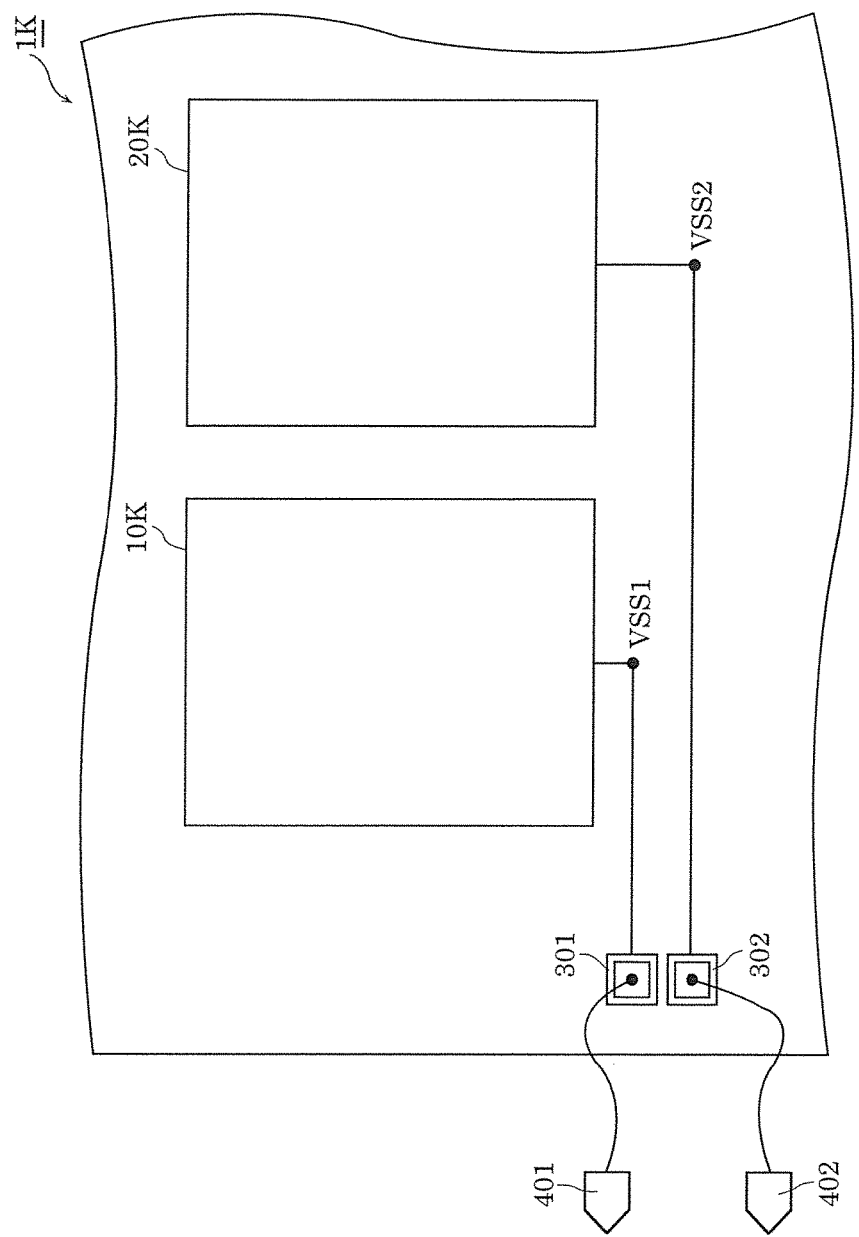
FIG. 22 is a schematic connection diagram of a semiconductor device, according to Embodiment 12.

It should be noted that a semiconductor device may include a power supply system that is separated up to a package pin of the semiconductor device. FIG. 22 is a schematic connection diagram of semiconductor device 1K, according to Embodiment 12. Domain 10K and domain 20K shown in FIG. 22 correspond, respectively, to the domain that includes the first circuit (domain 10 in Embodiment 1, for example) and the domain that includes the second circuit (domain 20 in Embodiment 1, for example) in Embodiments 1 to 10 described above.

Each of package pins 401 and 402 shown in FIG. 22 is a lead frame (external electrode) of semiconductor device 1K.

Package pin 401 is connected to pad 301 through wire bonding, and package pin 402 is connected to pad 302 through wire bonding.

As shown in FIG. 22, domain 10K and domain 20K are provided with ground power supplies VSS1 and VSS2, respectively, which are separated up to package pins 401 and 402, according to the present embodiment. By applying one of Embodiments 1 to 10 to semiconductor device 1K in which the power supply system is divided up to package pins 401 and 402 in this way, a layout can be achieved in a small area while a surge protection capability is enhanced sufficiently.

More specifically, since semiconductor device 1K has one of the configurations described in Embodiments 1 to 10, the present embodiment can achieve the same advantageous effect as Embodiments 1 to 10.

EMBODIMENT 13

Figure 23:
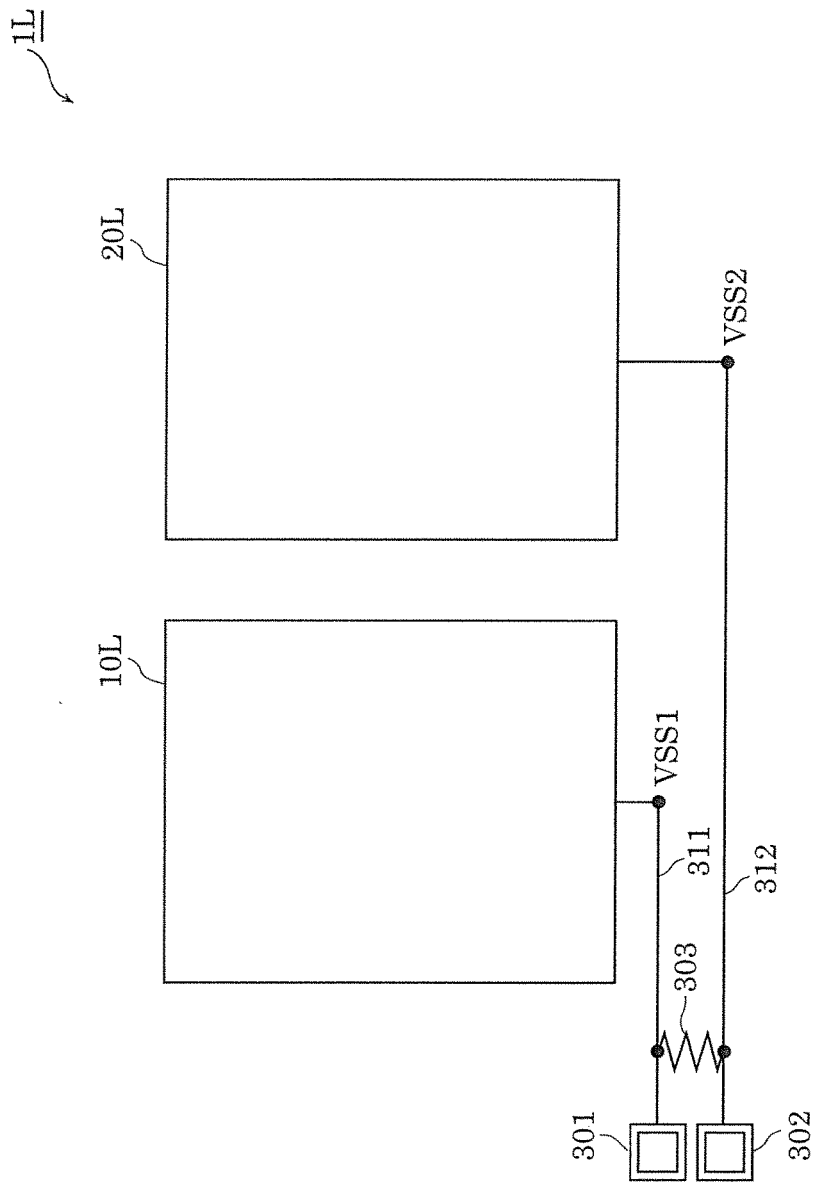
FIG. 23 is a schematic connection diagram of a semiconductor device, according to Embodiment 13.

It should be noted that divided power supply systems may be connected through a high-impedance component. FIG. 23 is a schematic connection diagram of semiconductor device 1L, according to Embodiment 13. Domain 10L and domain 20L shown in FIG. 23 correspond, respectively, to the domain that includes the first circuit (domain 10 in Embodiment 1, for example) and the domain that includes the second circuit (domain 20 in Embodiment 1, for example) in Embodiments 1 to 10 described above.

As shown in FIG. 23, domain 10L and domain 20L are provided with ground power supplies VSS1 and VSS2, respectively. Here, line 311 that connects pad 301 and domain 10L and provides ground power supply VSS1 to ground power line 112 is connected to line 312 that connects pad 302 and domain 20L and provides ground power supply VSS2 to ground power line 122, through substrate resistance 303 having a high resistance.

Even semiconductor device 1L that is connected to the power supply system through a high resistance, such as substrate resistance 303, outside domains 10L and 20L in this way, a surge protection capability between domains 10L and 20L needs to be ensured. Thus, by applying one of Embodiments 1 to 10 to semiconductor device 1L, a layout can be achieved in a small area while the surge protection capability is enhanced sufficiently.

More specifically, since semiconductor device 1L has one of the configurations described in Embodiments 1 to 10, the present embodiment can achieve the same advantageous effect as Embodiments 1 to 10.

OTHER EMBODIMENTS

Although Embodiments 1 to 13 have been described thus far, the present disclosure may include another embodiment implemented through a combination of arbitrary structural components described in the embodiments above. Furthermore, other embodiments implemented through various changes and modifications conceived by a person of ordinary skill in the art and various kinds of equipment having the semiconductor device according to the embodiments described above may be included in the scope in an aspect or aspects according to the present disclosure, unless such changes, modifications, and equipment depart from the scope of the present disclosure.

For example, the resistor of the protection circuit (in the protection cell) is formed in the diffusion region in the above description. However, when a part or a whole of the resistance is formed from a polysilicon or a well, the same advantageous effect as in the embodiments described above can also be achieved depending on a layout rule of the manufacturing process.

Moreover, for example, the cell height of the standard cell disposed in domain 10 may not be the same as the cell height of the standard cell disposed in domain 20. These cell heights may be included in a plurality of standardized cell heights and different from each other. Furthermore, the standard cell may not be disposed in domain 10. Moreover, domain 10 and domain 20 may not be formed in semiconductor substrate 40 that is one and the same. The semiconductor device may include a package in which domain 10 and domain 20 formed on different semiconductor substrates are sealed.

Furthermore, the NMOS transistor is described as an example of the protection transistor of the protection circuit in the above description. However, the protection transistor may be formed from a PMOS transistor. Moreover, the N-type diffusion layer is described as an example of the resistor of the protection circuit. However, the resistor may be formed from a P-type diffusion layer.

Furthermore, in Embodiments 3 and 4, the area of diffusion layer 44 formed in P-well 42 in plan view may be increased in a manner that diffusion layer 44 of the resistor and diffusion layer 44 of the cathode of the protection diode are formed as a common diffusion layer.

Figure 24:
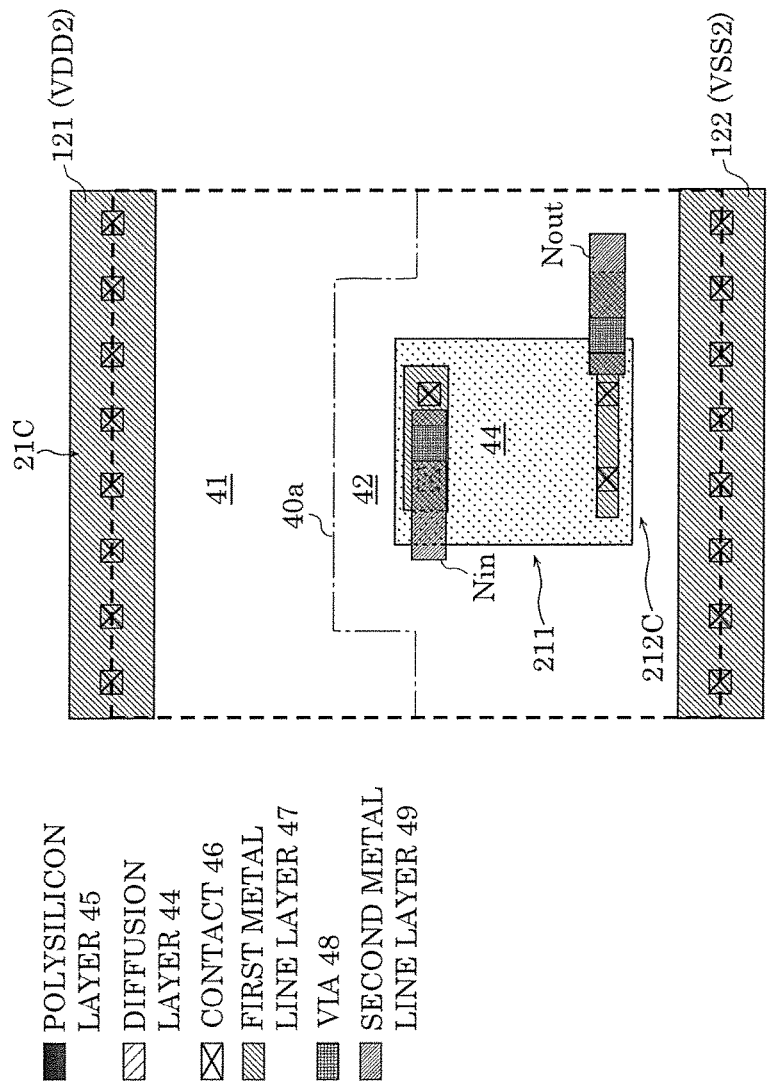
FIG. 24 is a layout diagram showing a detailed layout pattern of a protection cell, according to another embodiment.

For example, diffusion layer 44 of resistor 211 and diffusion layer 44 of protection diode 212C (see FIG. 10) according to Embodiment 4 may be formed as a common diffusion layer as shown in FIG. 24. FIG. 24 is a layout diagram showing a detailed layout pattern of protection cell 21C, according to another embodiment.

As shown in FIG. 24, the present embodiment is different from Embodiment 4 in that diffusion layer 44 forming the cathode of protection diode 212C and diffusion layer 44 forming resistor 211 are formed as a common diffusion layer. To be more specific, the node of protection diode 212C on the resistor 211 side is an end portion of diffusion layer 44 which is formed in semiconductor substrate 40 and from which resistor 211 is formed, according to the present embodiment.

Even with this configuration, the protection circuit formed in protection cell 21C can protect the second circuit from a surge occurring at the first circuit. More specifically, the present embodiment can achieve the same advantageous effect as Embodiment 4 described above.

Furthermore, diffusion layer 44 forming the cathode of protection diode 212C and diffusion layer 44 forming resistor 211 are formed as a common diffusion layer, according to the present embodiment. With this, a layout can be achieved in an even smaller area as compared with Embodiment 4.

Moreover, the resistor of the protection circuit and the second circuit may be short-circuited. Here, the term "short-circuited" refers to that two structural components are connected. Furthermore, the term "connected" in the above description refers to not only the case where two structural components are directly connected to each other, but also the case where these two structural components are connected through another structural component within a scope where the same function as in the former case can be achieved.

Furthermore, the resistor and the protector of the protection circuit may be disposed in different wells. For example, the resistor may be a diffusion resistance formed from P-type diffusion layer 44 formed in N-well 41, and the protector may be an N-type MOS transistor disposed in P-well 42.

When the resistor and the protector of the protection circuit are disposed in the different wells in this way, a cell width of the protection cell can be reduced without flexing well boundary 40a in the protection cell.

Moreover, the semiconductor device according to each of the embodiments above can protect the internal circuit (second circuit) from not only a surge due to electrostatic discharge, but also, for example, an overvoltage resulting from, for example, switching noise caused in the first circuit or the power supply. More specifically, the aforementioned surge refers to a phenomenon in which an abnormally high voltage (overvoltage) occurs instantaneously regardless of a factor of this surge.

Furthermore, the protection cell is disposed in domain 20 in the above description. However, a region of domain 20 can be assumed from a region in which the plurality of power lines 111 and the plurality of ground power lines 122 which extend linearly are arranged alternately in semiconductor device 1. To be more specific, the protection cell disposed in domain 20 can be defined as the cell in which, in plan view, the resistor and the protector of the protection circuit are interposed between power line 111 and ground power line 112 that are adjacent to each other.

Moreover, the plurality of signals outputted from the first circuit are inputted into the second circuit in the above description. In addition to this, at least one signal outputted from the second circuit may be inputted into the first circuit. In this case, the domain in which the first circuit is formed (domain 10 in FIG. 1, for example) may further include any one of the protection circuits described above.

To be more specific, the protection circuit includes: the resistor that is connected in series between the first circuit and the second circuit; and the protector that is interposed and connected between the node of the resistor on the first circuit side and the ground power line (for example, ground power line 112 in FIG. 10) and that clamps a potential difference between the node and the second ground power line to a predetermined voltage or lower. Moreover, the protection circuit is formed in the protection cell disposed in the predetermined region (for example, domain 10 in FIG. 1) and having a size, in the predetermined direction, that is an integer multiple of the size of the standard cell in the predetermined direction.

With this configuration, the first circuit can also be protected from a surge occurring at the second circuit.

Figure 25:
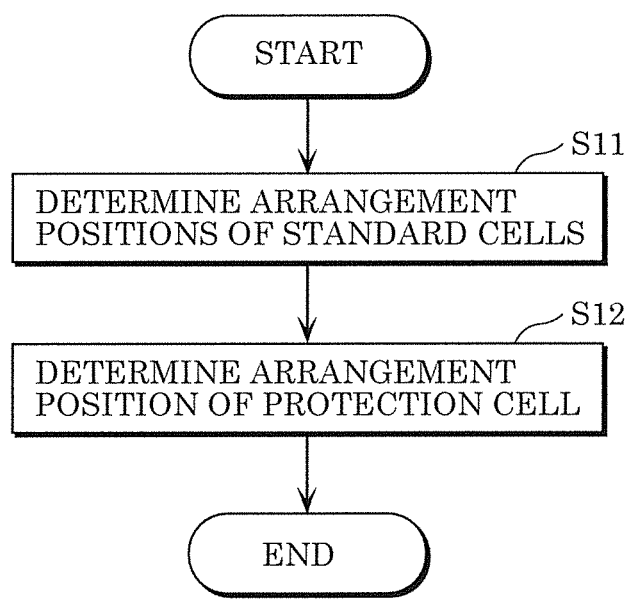
FIG. 25 is a flowchart showing a design method of a semiconductor device, according to another embodiment.

Furthermore, the present disclosure may be implemented as a design method of a semiconductor device. FIG. 25 is a flowchart showing a design method of a semiconductor device.

More specifically, the design method of the semiconductor device is a design method of a semiconductor device which includes a semiconductor substrate having a predetermined region in which a standard cell that is a circuit block defined in size in a predetermined direction is disposed. The semiconductor device includes: a first circuit that is connected to a first ground power line; a second circuit that is connected to a second ground power line independent of the first ground power line and is formed from the standard cell comprising a plurality of standard cells; and a protection circuit that is interposed and connected between the first circuit and the second circuit. The protection circuit includes: a resistor that is connected in series between the first circuit and the second circuit; and a protector that is interposed and connected between a node of the resistor on a second circuit side and the second ground power line and clamps a potential difference between the node and the second ground power line to a predetermined voltage or lower. The design method includes: determining, in the predetermined region, arrangement positions of the plurality of standard cells forming the second circuit (S11); and determining, in the predetermined region, an arrangement position of a protection cell in which the protection circuit is formed and which has a size, in the predetermined direction, that is two or more integer multiples of a size of the standard cell in the predetermined direction (S12).

To be more specific, the semiconductor device further includes a buffer that is interposed and connected between the resistor and the second circuit and that is formed in the protection cell. In the determining of the arrangement position of the protection cell (S12) in the design method of the semiconductor device, a delay time between cells including the protection cell and the standard cell is calculated by applying the same delay calculation method used for the standard cell, and the arrangement position of the protection cell is determined based on a result of the calculation.

Such a design method of a semiconductor device is implemented by, for example, a computer, such as a CAD (computer-aided design) device. The design method may be implemented by the computer through interaction between a designer and the computer.

It should be noted that the determining of the arrangement positions of the plurality of standard cells (S11) and the determining of the arrangement position of the protection cell (S12) may be performed in order, or performed in inverse order. Alternatively, these steps may be performed concurrently.

For example, timing and wiring property between the standard cell and the protection cell (between the circuit blocks) may be reflected using an automatic tool, such as an EDA. With this, these steps (S11 and S12) may be performed concurrently. In other words, the positions of the plurality of standard cells and the protection cell may be determined at the same time.

Here, the protection cell described above has the cell height that is an integer multiple of the cell height of the standard cell. To be more specific, the protection cell is reduced in area sufficiently to be disposed together with the standard cell. On this account, the positions of the protection cell and the standard cell can be determined at the same time.

Hence, these steps (S11 and S12) of the design method of the semiconductor device may be performed concurrently, for example. With this, the arrangement of the plurality of standard cells and the protection cell can be optimized. Furthermore, a possibility of layouts of the standard cells and the protection cell can be determined quickly. This can suppress a return in the design process.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor device according to the present disclosure can achieve adequate surge protection even when a large amount of surge current enters the semiconductor device. Hence, the semiconductor device is useful as, for example, a semiconductor integrated circuit built in electronic equipment, such as onboard equipment.

What is claimed is:

1. A semiconductor device which includes a semiconductor substrate having a predetermined region in which a standard cell that is a circuit block defined in size in a predetermined direction is disposed, the semiconductor device comprising:
   a first circuit that is connected to a first ground power line;
   a second circuit that is connected to a second ground power line independent of the first ground power line and is formed from the standard cell comprising a plurality of standard cells; and
   a protection circuit that is interposed and connected between the first circuit and the second circuit,
   wherein the protection circuit includes:
   a resistor that is connected in series between the first circuit and the second circuit; and
   a protector that is interposed and connected between a node of the resistor on a second circuit side and the second ground power line and clamps a potential difference between the node and the second ground power line to a predetermined voltage or lower, and
   the protection circuit is formed in a protection cell disposed in the predetermined region and having a size, in the predetermined direction, that is an integer multiple of a size of the standard cell in the predetermined direction.

2. The semiconductor device according to claim 1, wherein the resistor is formed from a diffusion layer formed in the semiconductor substrate.

3. The semiconductor device according to claim 1, wherein the semiconductor substrate includes, in the predetermined region, an N-well and a P-well at least one of which is formed in a shape of a strip along a direction perpendicular to the predetermined direction,
   a boundary between the N-well and the P-well is flexed in a plan view, and
   the protection circuit is disposed in one of the N-well and the P-well that is larger in area in the plan view.

4. The semiconductor device according to claim 1, wherein the protector is a transistor.

5. The semiconductor device according to claim 1, wherein the protector is a diode.

6. The semiconductor device according to claim 5, wherein a node of the diode on a second ground power line side is a substrate contact that connects the semiconductor substrate and the second ground power line.

7. The semiconductor device according to claim 5, wherein a node of the diode on a resistor side is an end portion of a diffusion layer which is formed in the semiconductor substrate and from which the resistor is formed.

8. The semiconductor device according to claim 1, comprising
   the second ground power line comprising a plurality of second ground power lines,
   wherein each of the plurality of second ground power lines is a power line that extends linearly in the predetermined region in a direction perpendicular to the predetermined direction, at a boundary between the standard cells adjacent to each other in the predetermined direction among the plurality of standard cells, and
   each of the plurality of second ground power lines is shared by the protection circuit and the second circuit.

9. The semiconductor device according to claim 8, wherein the plurality of second ground power lines have nearly a same line width in the predetermined region.

10. The semiconductor device according to claim 8, wherein the plurality of second ground power lines are formed in one and a same line layer in the predetermined region.

11. The semiconductor device according to claim 1, wherein the size of the protection cell in the predetermined direction is two or more integer multiples of the size of the standard cell in the predetermined direction.

12. The semiconductor device according to claim 1, further comprising
    an output circuit that is interposed and connected between the resistor and the second circuit.

13. The semiconductor device according to claim 12, wherein the output circuit is a buffer formed in the protection cell.

14. The semiconductor device according to claim 13, wherein when the protector and the buffer include respective transistors, gates of the respective transistors have shapes that extend in a same direction in the plan view.

15. The semiconductor device according to claim 12, wherein the output circuit is a logic gate formed in the standard cell.

16. The semiconductor device according to claim 1, wherein the resistor and the second circuit are short-circuited.

17. The semiconductor device according to claim 1, comprising
    the protection circuit comprising a plurality of protection circuits,
    wherein each of the plurality of protection circuits is formed in a corresponding one of a plurality of the protection cells that are disposed adjacent to each other in the predetermined direction.

18. The semiconductor device according to claim 17, wherein the plurality of protection cells are disposed at positions that are mutually a same in a direction perpendicular to the predetermined direction.

19. The semiconductor device according to claim 1, wherein the resistor is formed from one of a well formed in the semiconductor substrate in the protection cell and a polysilicon disposed on the semiconductor substrate.

20. A design method of a semiconductor device which includes a semiconductor substrate having a predetermined region in which a standard cell that is a circuit block defined in size in a predetermined direction is disposed,
    the semiconductor device including:
    a first circuit that is connected to a first ground power line;
    a second circuit that is connected to a second ground power line independent of the first ground power line and is formed from the standard cell comprising a plurality of standard cells; and
    a protection circuit that is interposed and connected between the first circuit and the second circuit,
    the protection circuit including:
    a resistor that is connected in series between the first circuit and the second circuit; and
    a protector that is interposed and connected between a node of the resistor on a second circuit side and the second ground power line and clamps a potential difference between the node and the second ground power line to a predetermined voltage or lower,
    the design method comprising:
    determining, in the predetermined region, arrangement positions of the plurality of standard cells forming the second circuit; and
    determining, in the predetermined region, an arrangement position of a protection cell in which the protection circuit is formed and which has a size, in the predetermined direction, that is an integer multiple of a size of the standard cell in the predetermined direction.

21. The design method of the semiconductor device according to claim 20,
wherein the semiconductor device further includes a buffer that is interposed and connected between the resistor and the second circuit and that is formed in the protection cell, and
in the determining of the arrangement position of the protection cell, a delay time between cells including the protection cell and the standard cell is calculated by applying a same delay calculation method used for the standard cell, and the arrangement position of the protection cell is determined based on a result of the calculation.

* * * * *